(12) United States Patent
Shepeleva et al.

(10) Patent No.: US 12,527,109 B2
(45) Date of Patent: Jan. 13, 2026

(54) OPTICAL CONTROL SWITCH AND ELECTRONIC DEVICE COMPRISING SAME

(71) Applicant: Samsung Electronics Co., Ltd., Suwon-si (KR)

(72) Inventors: Elena Aleksandrovna Shepeleva, Kostroma (RU); Mikhail Nikolaevich Makurin, Moscow region (RU); Chongmin Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 596 days.

(21) Appl. No.: 17/694,064

(22) Filed: Mar. 14, 2022

(65) Prior Publication Data
US 2022/0199849 A1 Jun. 23, 2022

Related U.S. Application Data

(63) Continuation of application No. PCT/KR2020/017490, filed on Dec. 2, 2020.

(30) Foreign Application Priority Data

Dec. 3, 2019 (RU) .......................... RU2019139304
Nov. 30, 2020 (KR) ........................ 10-2020-0165063

(51) Int. Cl.
*H10F 55/255* (2025.01)
*H01L 23/66* (2006.01)
(Continued)

(52) U.S. Cl.
CPC ........... *H10F 55/255* (2025.01); *H01L 23/66* (2013.01); *H01L 2223/6627* (2013.01); *H01Q 3/2676* (2013.01); *H01S 5/183* (2013.01)

(58) Field of Classification Search
CPC ....... H01L 31/173; H01L 31/09; H01L 23/66; H01L 2223/6627; H01Q 3/2676;
(Continued)

(56) References Cited

U.S. PATENT DOCUMENTS

| 4,329,686 A | 5/1982 | Mourou |
| 5,227,621 A | 7/1993 | Kim et al. |

(Continued)

FOREIGN PATENT DOCUMENTS

| CA | 2 619 611 A1 | 8/2009 |
| CN | 1227518 A | 9/1999 |

(Continued)

OTHER PUBLICATIONS

Haglund et al. Silicon-integrated short-wavelength hybridcavity VCSEL (Dec. 2015).

(Continued)

Primary Examiner — Fernando L Toledo
Assistant Examiner — Marshall Mu-Nuo Hatfield
(74) Attorney, Agent, or Firm — Jefferson IP Law, LLP

(57) ABSTRACT

An optically-controlled switch is provided. The optically-controlled switch includes a circuit board including a transmission line and a photoconductive switching region that is adjacent to the transmission line and has electrical properties controllable by light and a laser located on the circuit board and configured to emit light toward the photoconductive switching region.

13 Claims, 16 Drawing Sheets

(51) Int. Cl.
*H01Q 3/26* (2006.01)
*H01S 5/183* (2006.01)

(58) Field of Classification Search
CPC .... H01S 5/183; H01S 5/0234; H01S 5/18311; H01P 1/15
See application file for complete search history.

(56) References Cited

U.S. PATENT DOCUMENTS

| | | | |
|---|---|---|---|
| 5,432,167 | A | 7/1995 | Brismar |
| 6,461,228 | B2 | 10/2002 | Stocker et al. |
| 6,900,072 | B2 | 5/2005 | Patel et al. |
| 6,969,635 | B2 | 11/2005 | Patel et al. |
| 7,442,932 | B2 | 10/2008 | Schultz et al. |
| 7,689,070 | B2 | 3/2010 | Ouchi |
| 8,699,540 | B2 | 4/2014 | Sato |
| 9,130,651 | B2 | 9/2015 | Tabe |
| 9,431,564 | B2 | 8/2016 | Davies |
| 9,716,202 | B2 | 7/2017 | Curry et al. |
| 9,743,357 | B2 | 8/2017 | Tabe |
| 10,196,271 | B2 | 2/2019 | Zhang et al. |
| 10,802,375 | B2 | 10/2020 | Makurin et al. |
| 11,277,123 | B2 | 3/2022 | Makurin et al. |
| 2002/0132389 | A1 | 9/2002 | Patel et al. |
| 2003/0015707 | A1 | 1/2003 | Bosco et al. |
| 2003/0054588 | A1 | 3/2003 | Patel et al. |
| 2003/0133641 | A1 | 7/2003 | Yoo |
| 2004/0067006 | A1 | 4/2004 | Welch et al. |
| 2005/0042792 | A1 | 2/2005 | Patel et al. |
| 2006/0085160 | A1 | 4/2006 | Ouchi |
| 2009/0219511 | A1 | 9/2009 | Itsuji |
| 2012/0032876 | A1 | 2/2012 | Tabe |
| 2015/0187970 | A1* | 7/2015 | Curry ............... H03K 17/78 250/214 SW |
| 2015/0214425 | A1 | 7/2015 | Taylor |
| 2017/0084365 | A1* | 3/2017 | Nguyen ............... H01S 5/0615 |
| 2017/0095667 | A1 | 4/2017 | Yakovlev et al. |
| 2017/0104269 | A1* | 4/2017 | Bowden ............... H01Q 1/36 |
| 2019/0086763 | A1 | 3/2019 | Makurin et al. |
| 2019/0277703 | A1* | 9/2019 | Valouch ............... G01J 5/04 |
| 2020/0382118 | A1* | 12/2020 | Voss ............... H01L 31/0288 |
| 2022/0026482 | A1 | 1/2022 | Cole |

FOREIGN PATENT DOCUMENTS

| | | | |
|---|---|---|---|
| CN | 1081339 | C | 3/2002 |
| CN | 1482835 | A | 3/2004 |
| CN | 1988127 | A | 6/2007 |
| CN | 101095239 | A | 12/2007 |
| CN | 101170239 | A | 4/2008 |
| CN | 100459095 | C | 2/2009 |
| CN | 101437663 | A | 5/2009 |
| CN | 101734609 | A | 6/2010 |
| CN | 102095805 | A | 6/2011 |
| CN | 102743191 | A | 10/2012 |
| CN | 103023575 | A | 4/2013 |
| CN | 103034011 | A | 4/2013 |
| CN | 103319035 | A | 9/2013 |
| CN | 103359858 | A | 10/2013 |
| CN | 103359859 | A | 10/2013 |
| CN | 103382063 | A | 11/2013 |
| CN | 103382066 | A | 11/2013 |
| CN | 103395921 | A | 11/2013 |
| CN | 103395923 | A | 11/2013 |
| CN | 103449641 | A | 12/2013 |
| CN | 103449644 | A | 12/2013 |
| CN | 103449648 | A | 12/2013 |
| CN | 103466863 | A | 12/2013 |
| CN | 103466864 | A | 12/2013 |
| CN | 104133346 | A | 11/2014 |
| CN | 103034011 | B | 1/2015 |
| CN | 103023575 | B | 5/2015 |
| CN | 104697972 | B | 6/2015 |
| CN | 104879656 | A | 9/2015 |
| CN | 204647883 | U | 9/2015 |
| CN | 103395921 | B | 1/2016 |
| CN | 105228434 | A | 1/2016 |
| CN | 103359859 | B | 3/2016 |
| CN | 105607431 | A | 5/2016 |
| CN | 105911257 | A | 8/2016 |
| CN | 106018747 | A | 10/2016 |
| CN | 106092503 | A | 11/2016 |
| CN | 104076613 | B | 12/2016 |
| CN | 104821048 | B | 3/2017 |
| CN | 106530899 | A | 3/2017 |
| CN | 104697974 | B | 9/2017 |
| CN | 206574294 | U | 10/2017 |
| CN | 206863730 | U | 1/2018 |
| CN | 107768294 | A | 3/2018 |
| CN | 106092503 | B | 6/2018 |
| FR | 2 644 629 | B1 | 1/1992 |
| KR | 10-2007-0054760 | A | 5/2007 |
| KR | 10-2007-0114202 | A | 11/2007 |
| KR | 10-0787988 | B1 | 12/2007 |
| KR | 10-2019-0011818 | A | 2/2019 |
| KR | 10-2019-0031120 | A | 3/2019 |
| KR | 10-2019-0132952 | A | 11/2019 |
| KR | 20190132952 | A * | 11/2019 |
| RU | 2 685 768 | C9 | 8/2019 |
| SE | 501 217 | C2 | 12/1994 |
| WO | 88/006351 | A1 | 8/1988 |
| WO | 00/049589 | A1 | 8/2000 |
| WO | 02/075794 | A2 | 9/2002 |
| WO | 03/009355 | A1 | 1/2003 |
| WO | 2007/015710 | A2 | 2/2007 |
| WO | 2015/116435 | A2 | 8/2015 |
| WO | 2015/196164 | A2 | 12/2015 |
| WO | 2019/028269 | A2 | 2/2019 |

OTHER PUBLICATIONS

Korean Office Action dated Jul. 24, 2024, issued in Korean Patent Application No. 10-2020-0165063.
International Search Report dated Mar. 5, 2021, issued in International Patent Application No. PCT/KR2020/017490.
Russian Office Action dated Mar. 24, 2020, issued in Russian Patent Application No. 2019139304.
Russian Search Report dated Feb. 20, 2020, issued in Russian Patent Application No. 2019139304.

* cited by examiner

⬤ Areas for ion bombing

OPTICAL CONTROL SWITCH AND ELECTRONIC DEVICE COMPRISING SAME

CROSS-REFERENCE TO RELATED APPLICATION(S)

This application is a continuation application, claiming priority under § 365(c), of an International application No. PCT/KR2020/017490, filed on Dec. 2, 2020, which is based on and claims the benefit of a Russian patent application number 2019139304, filed on Dec. 3, 2019, in the Russian Intellectual Property Office, and of a Korean patent application number 10-2020-0165063, filed on Nov. 30, 2020, in the Korean Intellectual Property Office, the disclosure of each of which is incorporated by reference herein in its entirety.

BACKGROUND

1. Field

The disclosure relates to radio engineering. More particularly, the disclosure relates to an optically-controlled millimeter-wave switch based on a transmission line with a semiconductor substrate.

2. Description of Related Art

Currently, millimeter-wave networks and devices, such as 5th-Generation (5G) and 6th-Generation (6G), Wireless Gigabit Alliance (WiGig), automotive radars, and the like, are actively developed. The appearance of such new applications in a frequency range above extremely high frequencies (EHF, 30-3000 GHz) requires a new class of elements and circuits (active elements, antennas, printed circuit boards, feeders and switching devices) that may integrate within single device data transmission, detection capabilities, and capabilities of searching an optimal transmission direction. In particular, for many applications, a switch is an important component, because it allows to control the switching of signal propagation channels.

Meanwhile, at frequencies above 30 GHz, the wavelengths of the propagating waves are very small, and any discontinuities in the paths, which would not be significant for lower frequencies, may lead to parasitic and noise effects, such that in order to avoid such effects, a high-precision transmission line design with low losses per unit length is required. Accordingly, conventional switches for lower frequencies become inappropriate due to high losses.

Control for frequencies above 30 GHz are extremely complex and expensive, and therefore, among available technologies for the millimeter-wave range, optically-controlled switches based on substrate integrated waveguide (SIW)-structures (e.g., US 2019/086763 A1, 12, Sep. 2018, Samsung Electronics) have a special interest, because in an intended range (approximately 10 to 40 GHz) they are characterized by a simple construction and manufacturing, a cost-effective method of embedding in a single dielectric substrate, the absence of complex transitions, wide bandwidth, convenience of integration with classical printed circuit board (PCB) technologies, as well as good isolation of supply and bias circuits from a radio frequency (RF) path, low losses, and the high available passing power. Such switch includes a PCB including top and bottom layers and a dielectric layer between the top and bottom layers, a plurality of vias electrically connected to the top and bottom layers and located in at least two rows, an electrically shorting via, and a photoconductive element electrically connected to the bottom layer, separated from the top layer by a dielectric gap, and electrically connected to the top layer and the shorting via. The photoconductive element includes a dielectric state and a conductor state, and an electromagnetic wave provided to the optically-controlled switch propagates or is blocked through a waveguide formed between the at least two rows. However, at frequencies above 40 GHz in such switch, a parasitic radiation occurs through both partially covered and fully covered dielectric gaps, because the photoconductive element is made of materials having a relatively high dielectric constant (e.g., about 12 for silicon), which creates conditions for radiation from this gap as from a ring radiator. As a result, losses are increased, matching in the RF path in an open state is degraded, sensitivity to external crosstalk is increased, ON/OFF isolation is degraded, and more optical power is required from a control light source, which leads to its heating and reducing its working life.

The above disadvantages are mainly due to the fact that this switch, like most radio frequency devices existing in the related art, is based on PCB manufacturing technologies, while these technologies have certain limitations for frequencies above 30 GHz. The known problems of such technologies are as follows.

Uncontrollable etching of copper lines may not provide high precision in manufacturing, while being limited in best cases to ~+/−20 μm, which results in insufficient accuracy of copper strip width and via positioning, and thus in non-compliance with the required width of gaps in metallization, as well as to significant surface roughness. This is critical for frequency of 30 GHz or higher. This is because at such frequencies, discontinuities occur due to all these inaccuracies of manufacturing, due to which the deviation of actual characteristics of the transmission line from the calculated characteristics and high losses in the dielectric and conductors occur.

Copper line thickness in existing PCB technologies is relatively large. For this reason, at frequencies over 30 GHz, the corresponding parasitic reactance occurs, which should be compensated using additional components, which in turn leads to additional losses, increasing sizes and narrowing the bandwidth.

For efficient line switching, a large amount of photoconductive material is required, and as a result there is a limitation of the operating speed of the switch.

Recently, a vertical-cavity surface-emitting laser (or simply a vertical-emitting laser (VCSEL)) has gained popularity. It is very convenient for practical usage to use an array of such VCSEL lasers, and however, low density of packing feed lines and switches on the printed circuit board leads to the fact that only a small amount of VSCELs is used from the entire array. Consequently, the required VCSEL array size is increased and, accordingly, its cost is increased.

The dielectric substrates for printed circuit boards available on the market have a relatively large thickness, which makes the miniaturization of EHF devices and EHF lines more difficult.

Accordingly, the EHF switches existing in the market are bulky, complex and expensive, have very high losses, and are inconvenient for integration due to required isolation of supply/bias circuits.

At present, in the related art, there are no known EHF switches in the range over 70 GHz available on the market, which are capable of performing an opened-closed key function for waves passing therethrough and would not be subjected to the aforementioned problems. Only solutions from an adjacent field of the art are known, which may be considered as partially solving these problems.

For example, U.S. Pat. No. 9,431,564 B2 (Aug. 30, 2016, Thales Holding UK PLC) discloses a photoconductive switch including a photoconductive material and first and second contacts provided on the photoconductive material, in which the first and second contacts include a plurality of interdigitated tracks, the tracks of each contact being separated from the tracks of the other contact by a photoconductive gap, the tracks being curved such that the minimum photoconductive gap measured in a first direction remains substantially similar regardless of the orientation of the first direction. However, the function of this switch is only to modulate millimeter waves passing through it, and it is not suitable for their complete blocking, since it has a parasitic capacitance, due to which additional leakage of waves occurs and isolation is degraded.

Patent U.S. Pat. No. 9,716,202 B2 (25 Jul. 2017, The Curators of the University of Missouri, Columbia, Mo.) discloses a solid-state optically activated switch that may be used as limiting switch in a variety of applications or as a high voltage switch. In particular, the switch may incorporate the photoconductive properties of a semiconductor to provide the limiting function in a linear mode. In an embodiment, a configuration of the switch allows for greater than 99.9999% off-state transmission and an on-state limiting of less than 0.0001% of the incident signal. The difference in the essence and in implementation of this known solution consists in that its application is limited to only a power limiter, where a signal must not be reflected, but either be absorbed or tapped to attenuators, and for its effective work, semiconductor material therein must include a nitride, what requires large optical power to activate the switch. In addition, this document does not describe how to realize a switch with an integrated light source, and the allegedly coplanar structure described therein is not actually coplanar. This is because it does not imply a coplanar transmission line configuration for distributing the electromagnetic field in its cross section at high frequencies, but merely represents a conductor partially surrounded by ground to divert part of the signal.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, aspect of the disclosure is to provide an optically-controlled switch which includes a transmission line and is capable of further precisely controlling a signal in an extremely high frequency (EHF) range.

Another aspect of the disclosure is to provide an electronic device including any one optically-controlled switch described above.

Additional aspects will be set forth in part in the description which follows and, in part, will be apparent from the description, or may be learned by practice of the presented embodiments.

In accordance with an aspect of the disclosure, an optically-controlled switch is provided. The optically-controlled switch includes a circuit board including a transmission line and a photoconductive switching region that is adjacent to the transmission line and has electrical properties controllable by light and a laser located on the circuit board and configured to emit light toward the photoconductive switching region.

The circuit board and the laser may be integrally integrated.

In accordance with another aspect of the disclosure, a laser is provided. The laser includes a lower reflection layer disposed on the circuit board, an active layer disposed on the lower reflection layer, and an upper reflection layer disposed on the active layer, in which a reflectivity of the lower reflection layer is lower than a reflectivity of the upper reflection layer.

In accordance with another aspect of the disclosure, a circuit board is provided. The circuit board includes a substrate including a semiconductor material and including the photoconductive switching region, and a first conductive layer disposed on the substrate to form a signal line of the transmission line and including a pattern by which the photoconductive switching region is opened.

The transmission line may include the first conductive layer and a dielectric layer disposed on the first conductive layer.

The transmission line may be a grounded coplanar waveguide, and the first conductive layer may include the signal line in a strip form covering a part of an upper portion of the photoconductive switching region and extending in a direction and two ground surfaces disposed apart from each other on both sides of the signal line coplanarly with the signal line.

The signal line may have a non-uniform thickness in a part of a region facing the photoconductive switching region.

The signal line may have a grid pattern.

The transmission line may further include a second conductive layer disposed on the dielectric layer and being a ground layer of the transmission line, and including a pattern by which a position facing the photoconductive switching region is opened.

The second conductive layer may have a mesh pattern.

The transmission line may be a micro stripline, and the first conductive layer may include two segments spaced apart from each other with the photoconductive switching region therebetween.

The transmission line may be a grounded coplanar waveguide, and the first conductive layer may include the signal line in a strip form covering a part of an upper portion of the photoconductive switching region and extending in a direction and two ground surfaces disposed apart from each other on both sides of the signal line coplanarly with the signal line.

The signal line may have a non-uniform thickness in a part of a region facing the photoconductive switching region.

The signal line may have a grid pattern.

The transmission line may be a substrate integrated waveguide including the first conductive layer, the substrate, and a second conductive layer formed on a bottom surface of the substrate.

A thickness of the substrate may be less than or equal to a predetermined reference length determined according to a diffusion length of the semiconductor material and a wavelength of the light in the light source.

The substrate integrated waveguide may further include a plurality of conductive vias that pass through the substrate are formed between the first conductive layer and the second conductive layer, and the plurality of conductive vias may be arranged in two rows to form two conductive sidewalls with the photoconductive switching region therebetween.

The photoconductive switching region may include a plurality of photoconductive switching regions in a direction traversing the two conductive sidewalls.

The photoconductive switching region may include a plurality of photoconductive switching region arranged two-dimensionally, and the first conductive layer may have a pattern including a plurality of openings respectively facing the plurality of conductive switching regions, and some of the plurality of photoconductive switching regions may be selectively activated to form a reconfigurable conductive sidewall of the substrate integrated waveguide.

A size of the gap, an aperture size of the laser, and a carrier diffusion length in the photoconductive switching region may be substantially similar.

The photoconductive switching region may be made in the substrate by using a process of introducing a new recombination center to the semiconductor material.

The semiconductor material may have a longer carrier lifetime than a predetermined reference, and the process may be performed on a predetermined region, which is to be the photoconductive switching region, to reduce a carrier lifetime in the predetermined region.

The semiconductor material may have a shorter carrier lifetime than the predetermined reference, and the process may be performed on an edge region surrounding the predetermined region, which is to be the photoconductive switching region, to reduce a carrier lifetime in the edge region.

As the size of the optically-controlled switch is reduced, the optically-controlled switch is favorable to miniaturization and thus has low parasitic loss.

According to the optically-controlled switch, an insertion loss may be reduced in an extremely high frequency (EHF) range, power consumption may be reduced, and insulation between the ON/OFF states may be improved.

According to the optically-controlled switch, a switching speed may increase, an operating frequency band may increase, and simple integration into SoI and complementary metal oxide semiconductor (CMOS) devices may be possible.

The optically-controlled switch may have a cost-efficient structure operable in a millimeter (mm)-wave range of frequency of 30 GHz or higher, and may be used in various electronic devices.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIGS. 15A to 16B illustrate a schematic structure of an optically-controlled switch according to various embodiments of the disclosure;

FIGS. 15A and 15B are a perspective view and a cross-sectional view of an OFF state according to various embodiments of the disclosure;

FIGS. 16A and 16B are a perspective view and a cross-sectional view of an ON state according to various embodiments of the disclosure;

Throughout the drawings, like reference numerals will be understood to refer to like parts, components, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

An expression such as "above" or "on" may include not only the meaning of "immediately on in a contact manner", but also the meaning of "on in a non-contact manner".

Singular forms include plural forms unless apparently indicated otherwise contextually. When a portion is referred to as "comprises" a component, the portion may not exclude another component but may further include another component unless stated otherwise.

The use of the terms of "the above-described" and similar indicative terms may correspond to both the singular forms and the plural forms. The elements referred to in the singular forms do not exclude a plurality of the elements, unless specifically stated otherwise.

Terms such as first, second, and the like may be used to describe various elements, but the elements should not be limited to those terms. These terms may be used for the purpose of distinguishing one element from another element.

In this description, the term "and/or" includes any and all combinations of respective listed items.

Figure 1:
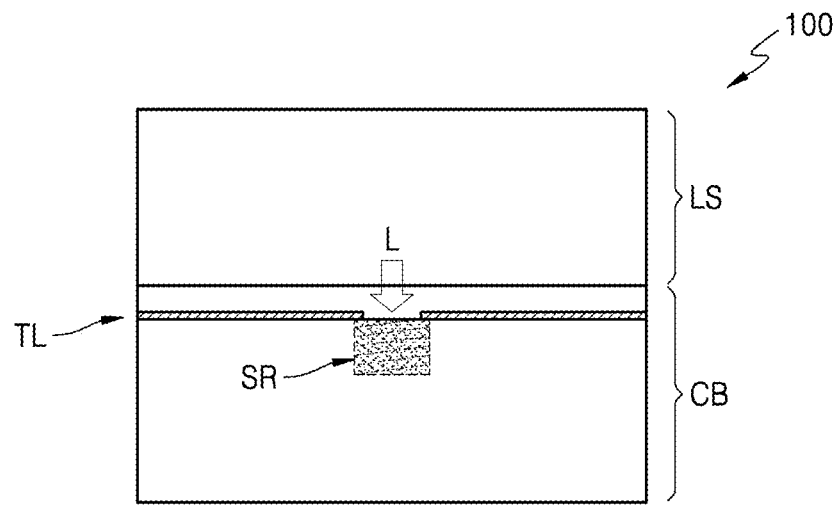
FIG. 1 conceptually illustrates structural characteristics of an optically-controlled switch according to an embodiment of the disclosure.

FIG. 1 conceptually illustrates structural characteristics of an optically-controlled switch according to an embodiment of the disclosure.

Referring to FIG. 1, an optically-controlled switch 100 may include a circuit board CB including a transmission line TL and a photoconductive switching region SR, and a light source LS arranged on the circuit board CB to irradiate light toward the photoconductive switching region SR. The circuit board CB and the light source LS may be integrally integrated, and the light source LS may be arranged such that a light-emitting direction is oriented toward the photoconductive switching region SR provided in the circuit board CB. The photoelectric switching region SR may be located adjacent to the transmission line TL and electrical properties thereof are controlled by light. For example, in a state in which light is not illuminated, the photoconductive switching region SR exhibits the properties of a dielectric and has electrical conductivity when the light is illuminated. Thus, the electrical properties of the photoelectric switching region SR may be switched according to ON/OFF of the light source LS, and the propagation of waves in the transmission line TL may be switched by reflection or transmission.

Figure 2:
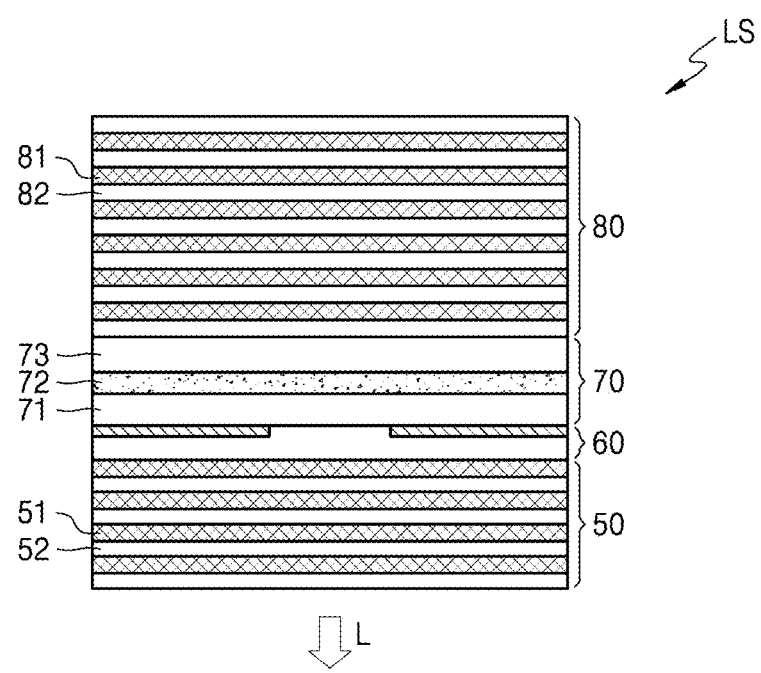
FIG. 2 is a cross-sectional view illustrating a structure of a light source included in an optically-controlled switch according to an embodiment of the disclosure.

FIG. 2 is a cross-sectional view illustrating a structure of a light source that may be included in an optically-controlled switch according to an embodiment of the disclosure.

The light source LS may be a laser and as shown, may be a vertical cavity surface emitting laser (VCSEL).

Referring to FIG. 2, the light source LS may include a light-emitting layer 70 for generating light, and a lower reflection layer 50 and an upper reflection layer 80 that are located on and under the light-emitting layer 70, respectively.

The light-emitting layer 70 may include an active layer 72, and a lower cladding layer 71 and an upper cladding layer 73 that are located on and under the active layer 72, respectively. The active layer 72 may include a group III-V semiconductor material and have a multi-quantum well structure, without being limited thereto.

The lower reflection layer 50 and the upper reflection layer 80 may be distributed Bragg reflectors (DBR), respectively. The lower reflection layer 50 may have a structure in which two material layers 51 and 52 having different refractive indexes are alternately stacked a plurality of times. The upper reflection layer 80 may have a structure in which two material layers 81 and 82 having different refractive indexes are alternately stacked a plurality of times. The reflectivity of the DBR may be determined according to the number of stacked layers. In an embodiment, the light formed in the active layer 72 may be emitted through the lower reflection layer 50, and to this end, the reflectivity of the lower reflection layer 50 may be set lower than the upper reflection layer 80. The upper reflection layer 80 may be a fully reflective DBR having a very high reflectivity, for example, 99.9% or more. The lower reflection layer 50 may exhibit a lower reflectivity than the upper reflection layer 80, for example, a reflectivity of about 95%, and may partially pass light therethrough. An oxide aperture layer 60 may be provided between the active layer 72 and the lower reflection layer 50 to adjust the beam diameter of the emitted light. The position of the oxide aperture layer 60 may not be limited to the shown position and may be changed to another position. The size of the aperture set by the oxide aperture layer 60 may be set to a similar degree comparable to the size of the photoelectric switching region SR.

For the optically-controlled switch 100, the light source LS and the circuit board CB may be separately manufactured and then bonded, or some configuration (e.g., the lower reflection layer 50 or a part thereof) of the light source LS may be manufactured based on the circuit board CB and the other configuration of the light source LS may be separately manufactured and then, they may be bonded to each other by a predetermined connection film (a connection interface or a bonding interface).

Hereinbelow, various embodiments of the optically-controlled switch 100 will be described. Embodiments describe various implementations of the circuit board CB where the transmission line TL and the photoconductive switching region SR are embedded, and since the configuration of the light source LS is common, the illustration of the light source LS will be omitted for convenience in the drawings below.

Figure 3:
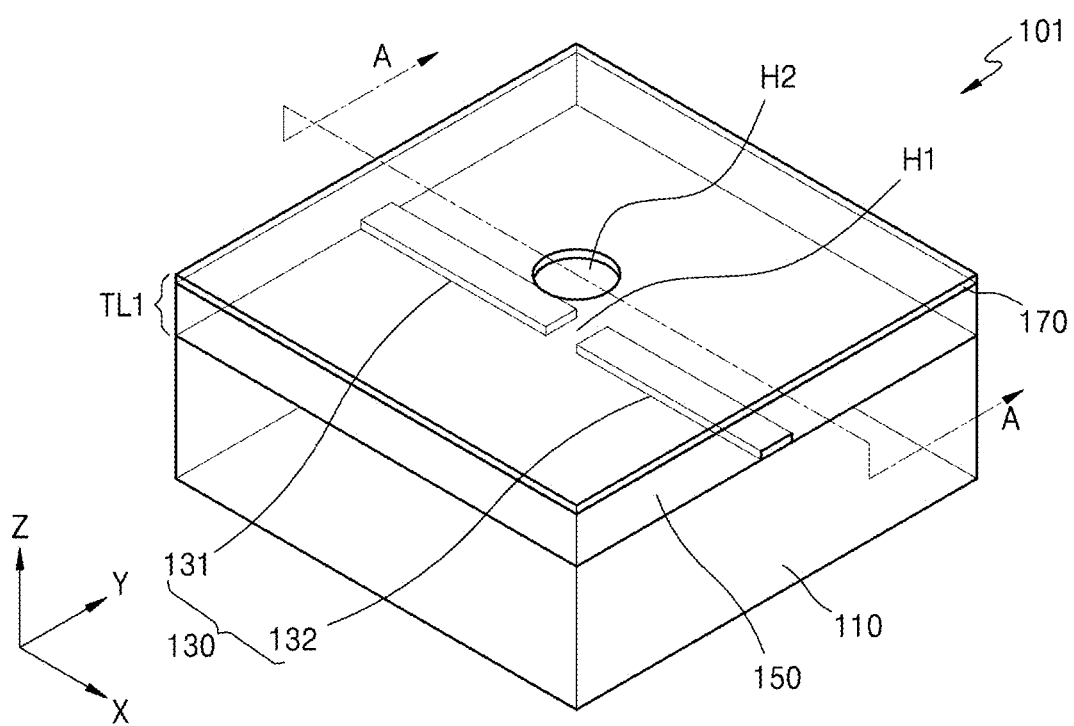
FIG. 3 is a perspective view illustrating a structure of an optically-controlled switch according to an embodiment of the disclosure.

FIG. 3 is a perspective view showing a structure of an optically-controlled switch according to an embodiment of the disclosure.

Figure 4:
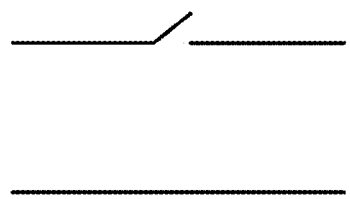
FIG. 4 illustrates an equivalent circuit where the optically-controlled switch of FIG. 3 functions as a serial-type switch according to an embodiment of the disclosure.

FIG. 4 illustrates an equivalent circuit where an optically-controlled switch of FIG. 3 functions as a serial-type switch according to an embodiment of the disclosure.

Figure 5A:
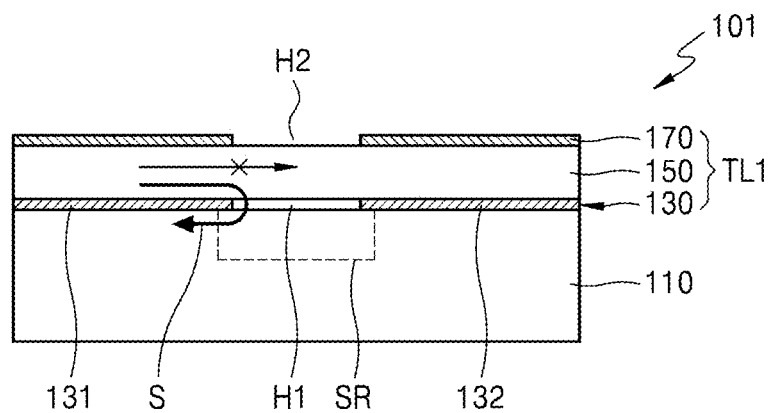
FIGS. 5A and 5B respectively illustrate a state in which a switch is turned off and a state in which a switch is turned on to describe an operating principle of the optically-controlled switch of FIG. 3 according to various embodiments of the disclosure.
Figure 5B:
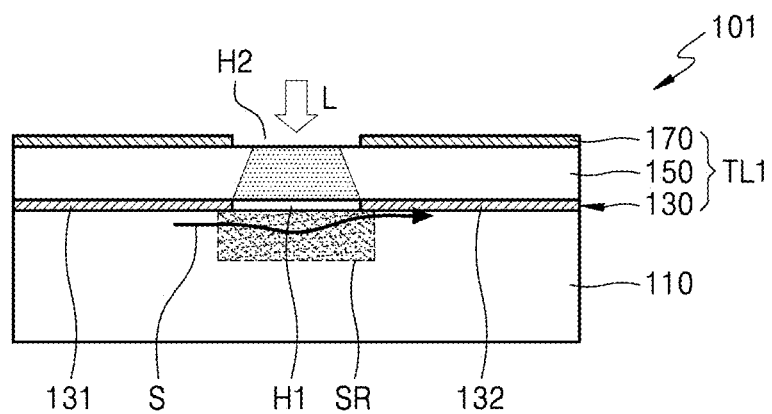

FIGS. 5A and 5B respectively illustrate a state in which a switch is turned off and a state in which a switch is turned on to describe an operating principle of the optically-controlled switch of FIG. 3 according to various embodiments of the disclosure.

Referring to FIG. 3, an optically-controlled switch 101 may include a substrate 110 having the photoelectric switching region SR and a transmission line TL1 disposed on the substrate 110. The transmission line TL1 may include a first conductive layer 130 disposed on the substrate 110, a dielectric layer 150 disposed on the first conductive layer 130, and a second conductive layer 170 disposed on the dielectric layer 150.

The substrate 110 may include a photoconductive material. The substrate 110 may include, for example, a semiconductor material that functions as a dielectric when there is no external effect. The substrate 110 may include a semiconductor material which has a property of a dielectric when light is not illuminated and has a property of a conductor when light is illuminated. The substrate 110 may include a high resistance semiconductor material such as silicon.

The first conductive layer 130 may form a signal line of a transmission line RL1 and have a pattern in a form that opens the photoelectric switching region SR formed in the substrate 110. That is, the first conductive layer 130 may have a pattern in which a gap H1 is formed in an area or region facing the photoelectric switching region SR. The first conductive layer 130 may include two segments 131 and 132 spaced apart from a predetermined interval at a position facing the photoconductive switching region SR, as a signal line in the form of a micro stripline.

The dielectric layer 150 may be made of, for example, silicon oxide (SiO2).

The second conductive layer 170 may be a ground layer that provides ground to the transmission line TL1. The second conductive layer 170 may have a pattern in which the position facing the photoconductive switching region SR is opened. That is, the second conductive layer 170 may have a pattern in which an opening H2 is formed in a region facing the photoconductive switching region SR.

The first conductive layer 130 and the second conductive layer 170 may include a variety of conductors such as gold, silver, copper, and the like, which have high electrical conductivity and are capable of implementing a desired pattern.

The gap H1 of the first conductive layer 130, the opening H2 of the second conductive layer, the photoconductive switching region SR, and an aperture of the optical source LS described in FIG. 2 have comparable similar sizes. They may have the same sizes or may be the same within a predetermined error range (e.g., 20%, 10%, or less). The photoconductive switching region SR may have a volume in which the substrate 110 starts from a surface facing the gap H1 of the first conductive layer 130 and extends in horizontal, vertical, and depth directions. The photoconductive switching region SR is omitted from FIG. 3 for convenience of illustration, and is shown only in FIGS. 5A and 5B. The size (cross-sectional area and volume) of the photoconductive switching region SR may be determined according to a carrier distribution determined by a material of the substrate 110 when a predetermined area in the substrate 110 is illuminated through the opening H2 of the second conductive layer 170 and the opening H1 of the first conductive layer 130, which will be described below with reference to FIGS. 9 to 11.

The optically-controlled switch 101 may be made according to a semiconductor process based on a silicon substrate. That is, the first conductive layer 130 may be patterned on the substrate 110 made of high-resistance silicon using an electronic lithography method, the dielectric layer 150 made of a silicon oxide may be stacked, and the second conductive layer 170 may be formed on the dielectric layer 150 in a desired pattern. The thickness of the dielectric layer 150 and the line width of the first conductive layer 130 may be set to comply with a required line impedance (e.g., 50 ohm). Next, as described above, the lower reflection layer 50 of the light source LS and the connection film may be further formed on the second conductive layer 170. Next, in a separate process, a light-emitting layer 70 and an upper reflection layer 80 of the light source LS may be manufactured. A structure of the light-emitting layer 70 and the upper reflection layer 80 may be grown based on, for example, a gallium arsenide (GaAs) substrate or other optically opaque substrate. These structures may be bonded to each other through a connection film or using another method.

From the perspective of the transmission line, the switch may be of a serial type or a parallel type, and the optically-controlled switch of FIG. 3 may be of a serial type.

Referring to FIG. 4, the two segments 131 and 132 of the transmission line TL1 are connected to the switching element.

The operating principle of the serial-type switch will be described with reference to FIGS. 5A and 5B. FIGS. 5A and 5B show the A-A cross section of FIG. 3.

Referring to FIG. 5A, when a light source (not shown) is in an OFF state, i.e., power is not supplied to a laser and the laser does not emit light, light does not reach the photoconductive switching region SR, such that the photoconductive switching region SR may be in an dielectric state. Thus, the two segments 131 and 132 forming the micro stripline may be opened without being connected to each other, such that a signal S provided to an input of the optically-controlled switch 101 may return through the gap H1 without going toward an output.

Referring to FIG. 5B, when power is supplied to the light source and light L illuminates the substrate 110 through the opening H2 of the second conductive layer 170 and the gap H1 of the first conductive layer 130, the photoelectric switching region SR enters a conductor state. Thus, the two segments 131 and 132 forming the micro stripline may be electrically connected and the signal S provided to the input of the optically-controlled switch 101 may be transmitted toward the output.

Figure 6:
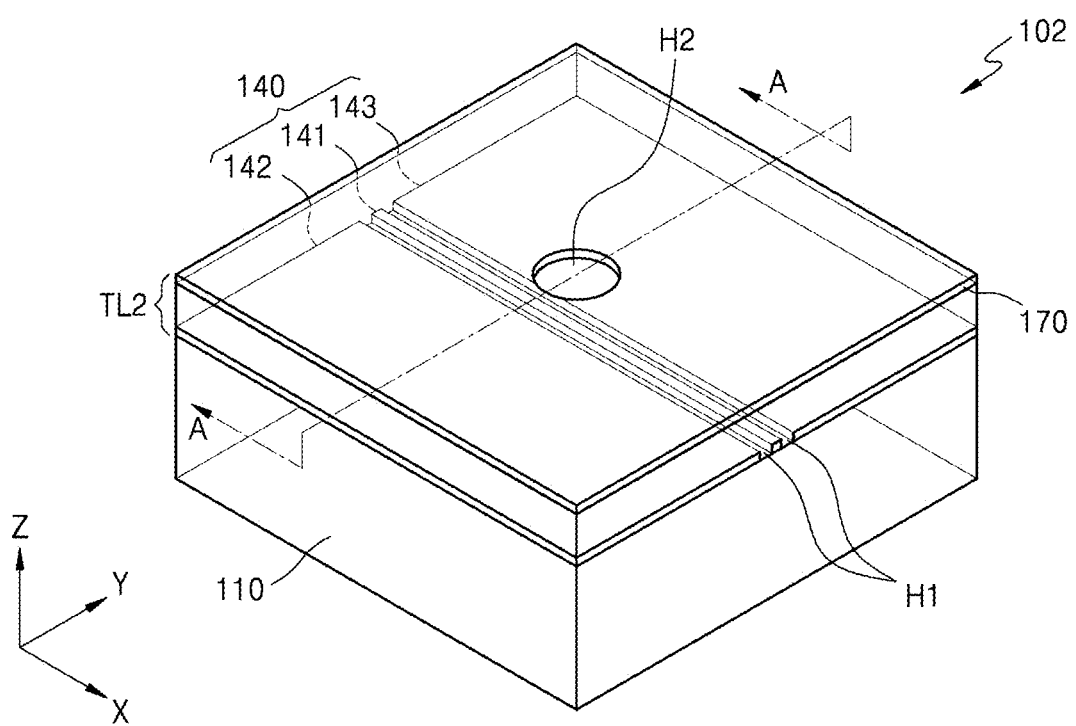
FIG. 6 is a perspective view illustrating a structure of an optically-controlled switch according to an embodiment of the disclosure.

FIG. 6 is a perspective view showing a structure of an optically-controlled switch according to an embodiment of the disclosure.

Figure 7:
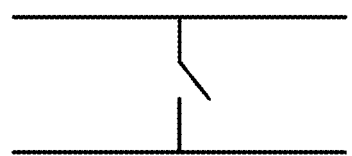
FIG. 7 illustrates an equivalent circuit where the optically-controlled switch of FIG. 6 functions as a parallel-type switch according to an embodiment of the disclosure.

FIG. 7 illustrates an equivalent circuit where the optically-controlled switch of FIG. 6 functions as a parallel-type switch according to an embodiment of the disclosure.

Figure 8A:
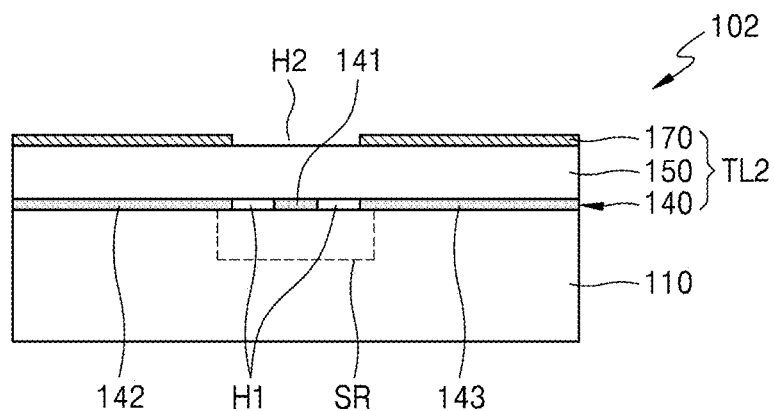
FIGS. 8A and 8B respectively illustrate a state in which a switch is turned off and a state in which a switch is turned on to describe an operating principle of the optically-controlled switch of FIG. 6 according to various embodiments of the disclosure.
Figure 8B:
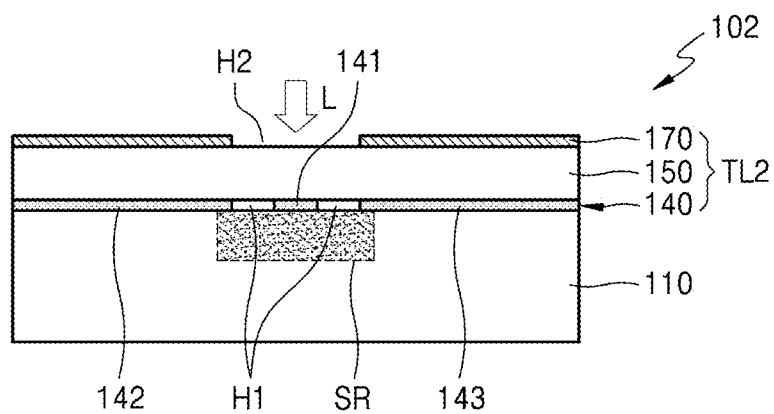

FIGS. 8A and 8B respectively illustrate a state in which a switch is turned off and a state in which a switch is turned on to describe an operating principle of the optically-controlled switch of FIG. 6 according to various embodiments of the disclosure.

An optically-controlled switch 102 may include a substrate 110 made of a photoconductive material and having the photoelectric switching region SR and a transmission line TL2 disposed on the substrate 110. The transmission line TL2 may include a first conductive layer 140 disposed on the substrate 110, a dielectric layer 150 disposed on the first conductive layer 140, and a second conductive layer 170 disposed on the dielectric layer 150.

The transmission line TL2 provided in the optically-controlled switch 102 of the embodiment may be a grounded coplanar waveguide. The first conductive layer 140 may include a signal line 141 in a form of a strip that covers a part of an upper portion of the photoconductive switching region SR and extends in a direction, and two ground surfaces 142 and 143 that are disposed apart from each other on opposite sides of the signal line 141 coplanarly with the signal line 141. The two ground surfaces 142 and 143 form a gap H1 of a predetermined interval with the signal line 141, and the light may illuminate the photoconductive switching region SR through the gap H1. The second conductive layer 170 may be a ground layer that provides additional ground to the transmission line TL2. The second conductive layer 170 may have a pattern in which an opening H2 is formed in a region facing the photoconductive switching region SR.

The optically-controlled switch of FIG. 6 may be of a parallel type, i.e., as shown in FIG. 7, the transmission line TL2 may be shunt by a switching element.

The operating principle of the parallel-type switch will be described with reference to FIGS. 8A and 8B. FIGS. 8A and 8B show the A-A cross-sectional view of FIG. 6.

Referring to FIG. 8A, when a light source (not shown) is in the OFF state, i.e., power is not supplied to a laser and the laser does not emit light, light does not reach the photoconductive switching region SR, such that the photoconductive switching region SR may be in the dielectric state. Thus, the gap H1 between the signal line 141 and the two ground surfaces 142 and 143 forming a coplanar waveguide may be maintained non-conductive, and the signal provided to the input of the optically-controlled switch 102 may be delivered to the output.

Referring to FIG. 8B, when power is supplied to the light source and the light illuminates the substrate 110 through the opening H2 of the second conductive layer 170 and the gap H1 of the first conductive layer 140, the photoelectric switching region SR enters the conductor state. Thus, the gap H1 between the signal line 141 and the two ground surfaces 142 and 143 forming the coplanar waveguide may be closed such that the signal line 141 and the ground surfaces 142 and 143 may be shorted and the signal provided to the input of the optically-controlled switch 102 may be shorted to the ground.

As described above, miniaturization of the optically-controlled switches 100, 101, and 102 generated by integrating the small transmission lines TL, TL1, and TL2 and the light source LS on the substrate 110 based on a semiconductor material may be achieved when the width of the signal line, the aperture size of the light source, and the diffusion length of the photoconductive material are similar to maintain balance between the optical power and aperture size of the light source LS, and the photoconductive switching regions SR achieved in the photoconductive material. However, they are not limited to the entirely same value, and may be similar within a predetermined error range (e.g., 20%, 10%, or less).

In an example embodiment, the width of the signal line may be about 10 μm, the laser beam diameter based on the aperture size of the light source may be about 10 μm, and the dimensions of the photoconductive switching region may be about 10×10 μm×10 μm.

The task of selecting the three specific values may include a process of setting the size of the photoconductive switching region SR and the width of the signal line in given known characteristics (aperture size, radiation power, and wavelength) of the selected light source. In this case, the selected material and manufacturing method and sufficient laser power to provide the required characteristics to switch the electrical properties of the photoconductive switching region SR may be considered.

For calculation simplification, the photoconductive switching region SR with predetermined characteristics that should be ensured (i.e., where edge effects do not act) may be assumed as a cube with width, length, and depth of d, to estimate a parameter when the photoconductive switching region SR is excited by light.

An electrical resistance R and an electrical capacitance C between the parallel surfaces of the cube may be estimated with the following relations.

$$R = \frac{1}{\sigma} \times \frac{d}{d \times d} = \frac{1}{\sigma d} \qquad \text{Equation 1}$$

$$C = \varepsilon\varepsilon_0 \frac{d \times d}{d} = \varepsilon\varepsilon_0 d \qquad \text{Equation 2}$$

Here, σ is a conductivity, and ε is a relative permittivity, and $\varepsilon_0$ is a permittivity in a free space.

Further, the conductivity σ of the photoconductive switching region SR may be calculated by the following formula:

$$\sigma = ne\mu \qquad \text{Equation 3}$$

Herein, n is a carrier concentration, e is an elementary electric charge (a fixed value), and μ is a carrier mobility (a fixed value for a given semiconductor).

Next, the Helmholtz equation may be used to determine the carrier concentration n.

$$\Delta_3 n - \frac{n}{s^2} = -\Phi \qquad \text{Equation 4}$$

Herein, Φ is a light function.

The boundaries of the photoconductive switching region SR may be substantially determined by a diffusion length s.

$$s = \sqrt{D\tau} \qquad \text{Equation 5}$$

Herein, D is a diffusion coefficient, and τ is a carrier lifetime in the photoconductive material.

An estimate for the required power consumption is as follows:

$$P \sim h\nu nV/\tau \sim N/\tau \qquad \text{Equation 6}$$

A ratio between the sizes of the light source LS and the photoconductive switching region SR may influence the required value of optical power. To implement the photoconductive switching region SR of a different size with the light source of a same size, different optical power may be required to ensure a defined carrier concentration value.

In addition to diffusion, the size of the photoconductive switching region SR may be limited by adjusting the carrier lifetime in a semiconductor. The bulk lifetime in a semiconductor may be reduced, for example, by introducing defects in its crystal structure. By moving the position of an edge of the photoconductive switching region SR (a region with low bulk lifetime) from a region where a defined conductivity level should be ensured, the recombination edge effects may be used to increase/decrease the effective carrier lifetime and increase/decrease the total ON/OFF time of the switch.

Therefore, depending on the purpose of a device including the optically-controlled switch, the optical power consumption and ON/OFF time of the optically-controlled switch may be optimized by selecting geometric parameters of the photoconductive switching region, the transmission line, and the light source.

For transition to higher operating frequencies, increase in the manufacturing accuracy, and reduction in a parasitic reactance associated with conductor thickness, the size of the transmission line is reduced in the micro order. By manufacturing the transmission line using a technique used to manufacture semiconductor devices, the limited accuracy of manufacturing printed circuit boards may be solved and the accuracy of manufacturing the micron-order switch may be improved.

Given such requirements and technology, in a particular embodiment, a general-purpose laser with an aperture of 10 μm, a power of 10 mW, and a wavelength of 850 nm may be selected as a light source. Accordingly, as the photoconductive switching region with defined characteristics that should be defined, a cube with each side d=10 μm may be selected. This value is 100 times lower than the dimensions d0 of the photoconductive elements conventionally used.

$$d_0 = 1000 \ \mu m \rightarrow 10^2 d_0 = 10 \ \mu m$$

Thus, the excitation region volume may be reduced like $$V_0 \rightarrow 10^{-6} - V_0.$$

Taking into account relations (1) and (2), the parasitic resistance of the photoconductive switching region SR may increase 100 times compared to the resistance R0 of the conventional photoconductive element, and the parasitic capacitance may be reduced 100 times.

$$R_0 \rightarrow 100 R_0$$
$$C_0 \rightarrow 0.01 C_0$$

Such scaling may positively influence on a reducing a parasitic capacitance, but negatively influence on the resistance. To reduce the resistance and return its value to an acceptable value without changing the size of the photoconductive switching region, it is necessary to increase its conductivity, as follows from (1).

$$\sigma_0 \rightarrow 100 \sigma_0.$$

Such conductivity, based on relations (3) and (4), may be ensured with a corresponding increase in carrier concentration.

$$n_o \rightarrow 100 n_o.$$

Then, in a considered volume of $10^{-6} V_0$, the number of carriers transferred to an excited state should be:

$$N_0 \rightarrow 10^{-4} N_0.$$

For a given (constant) power of the light source, in accordance with relation (6), the carrier lifetime in this material equals to $$\tau_0 \rightarrow 10^{-4} \tau_0.$$

The requirement to reduce the minority carrier lifetime may support the idea of miniaturization of the optically-controlled switch, because it defines the carrier diffusion length in the material, i.e. actual size of the photoconductive switching region. Based on such concept, a light source which has an aperture with smaller size than the size of the necessary photoconductive switching region by the length of the diffusion propagation of carriers in the photoconductive material may be selected.

The minority carrier lifetime may also define the duration of the processes of excitation and recombination of carriers in the material. When the minority carrier lifetime is reduced up to $10^{-4}\tau_0$, the switching speed of the photoconductive switching region may be increased up to about 10,000 times at the same power of the light source.

As an example of the calculation, when silicon is selected as the photoconductive material, with a diffusion coefficient for small regions of 29 cm²/sec and a carrier lifetime of 1 μs, then the diffusion length may be approximately 54 μm, which is suitable for the required size of the photoconductive switching region.

Figure 9:
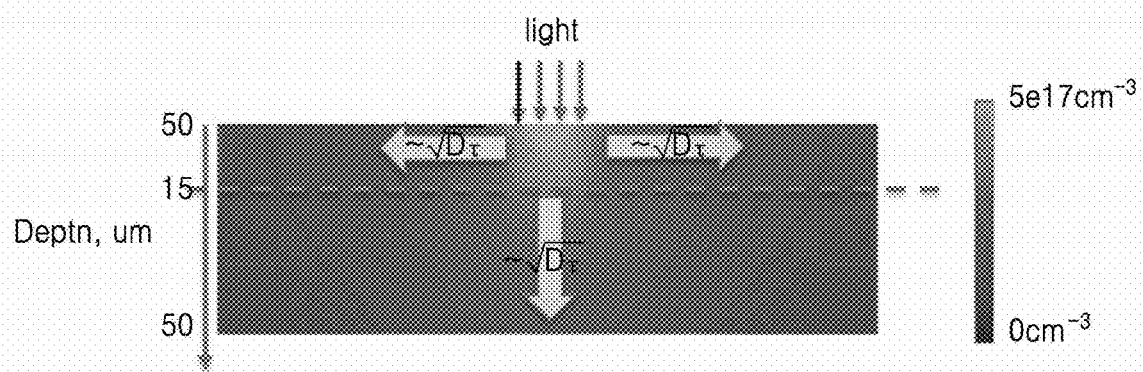
FIG. 9 illustrates a distribution of carriers excited in a photoconductive material when light is irradiated to the photoconductive material according to an embodiment of the disclosure.

FIG. 9 illustrates a distribution of carriers excited in a photoconductive material when light is irradiated to the photoconductive material according to an embodiment of the disclosure.

Referring to FIG. 9, an example of the distribution of excited carriers inside the silicon material when the aforementioned commercially available laser with an aperture of 10 μm, a power of 10 mW and a wavelength of 850 nm is selected as a light source, and a silicon material is used as a photoconductive material. The light penetration depth on average is 15 μm (shown by a dashed line), which is a suitable result. The conductive region depth equals to a sum of light penetration depth and diffusion length, and in general, the conductive region depth should be greater than skin depth determined according to the conductivity of the conductor at a given frequency. The conductive region depth set as described above may be a criterion for setting the depth of the photoconductive switching region SR.

Figure 10:
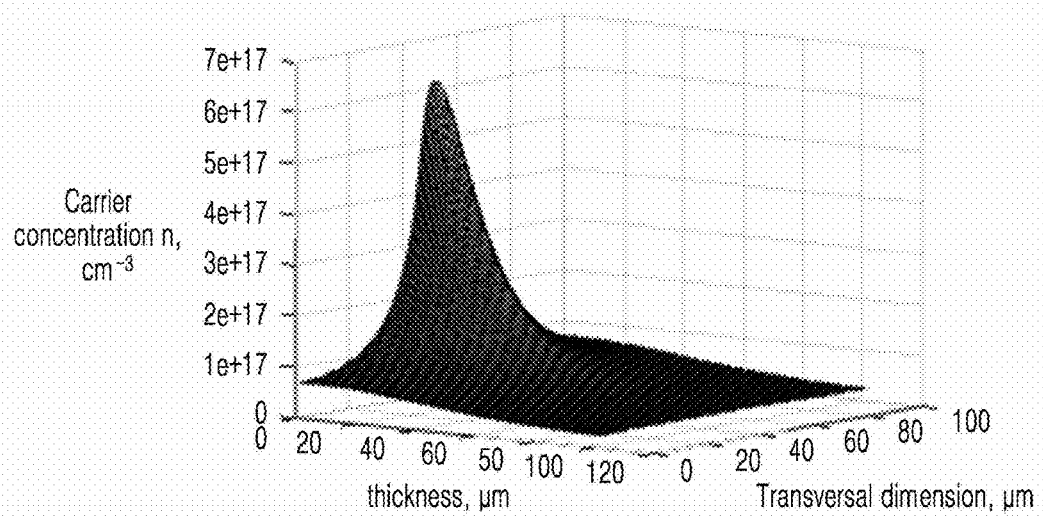
FIG. 10 is a graph showing a result of computer-simulating a carrier concentration inside a photoconductive material when light is irradiated to the photoconductive material according to an embodiment of the disclosure.

FIG. 10 is a graph showing a result of computer-simulating a carrier concentration inside a photoconductive material when light is irradiated to the photoconductive material according to an embodiment of the disclosure.

Referring to FIG. 10, the following parameters of the light source were selected: a cross-sectional area of a light beam of 10 μm×10 μm, a power of 10 mW and a wavelength of 850 nm. The following parameters of the photoconductive material: a diffusion coefficient of 29 cm$^2$/sec for the silicon material and the carrier lifetime of 1 μs.

Figure 11:
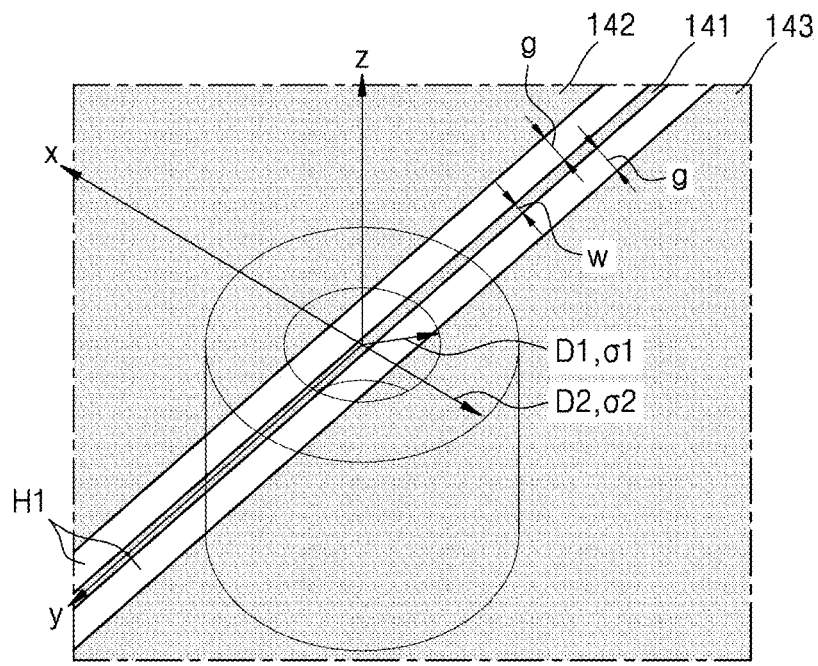
FIG. 11 illustrates conductivity distribution in an illuminated area in an optically-controlled switch of FIG. 6 according to an embodiment of the disclosure.

FIG. 11 illustrates conductivity distribution in an illuminated area in an optically-controlled switch of FIG. 6 according to an embodiment of the disclosure.

Referring to FIG. 11, the width w of the signal line 141 in the coplanar transmission line is set to about 2 μm, and a gap g between the signal line 141 and the ground surfaces 142 and 143 on both sides thereof is set to about 6 μm. The total line width including the two gaps may be about 14 μm. To ensure that the signal line 141 is shorted on the ground surfaces 142 and 143 when the optically-controlled switch is turned on, the size of the photoconductive switching region SR needs to exceed this total line width. The distribution of conductivity in the illuminated region is averaged as follows. In a region with a circular cross-section with a diameter D1 of about 25 μm, a maximum conductivity σ1 is about 10000 S/m, and in a region with a circular cross-section with a diameter D2 of 25 μm, a conductivity σ2 may be reduced to about 5000 S/m.

Figure 12:
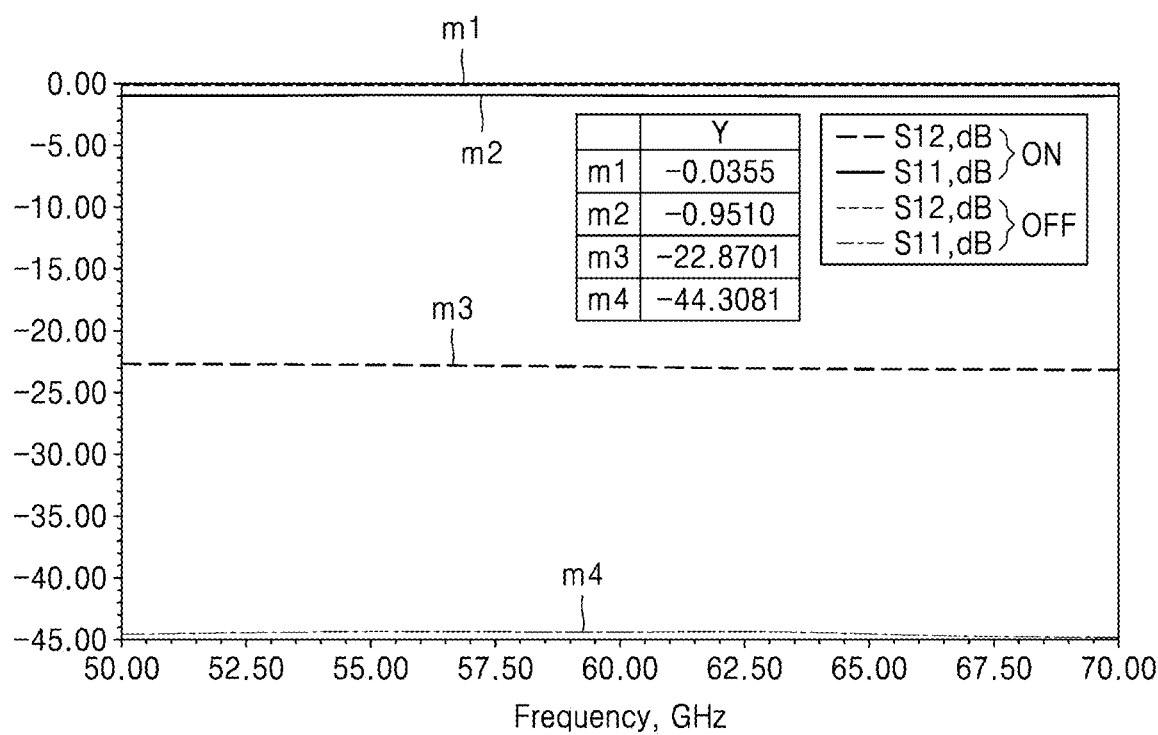
FIG. 12 is a graph showing a result of computer-simulating an S-parameter of an optically-controlled switch of FIG. 6 according to an embodiment of the disclosure.

FIG. 12 is a graph showing a result of computer-simulating an S-parameter of an optically-controlled switch of FIG. 6 according to an embodiment of the disclosure.

Referring to FIG. 12, a broadband switch with isolation between the ON/OFF states of more than 20 dB is obtained. As described above with reference to FIGS. 8A and 8B, while in the OFF state where the signal should completely pass to the output, a reflection coefficient S11 may be approximately −45 dB, and a transmission coefficient may be about −0.03 dB. In the ON state where the signal should be shorted, the reflection coefficient S11 may be approximately −0.95 dB, and the transmission coefficient S12 may be about −23 dB.

As such, an optically-controlled switch is provided in which a micron-sized switch may be used and a signal at a frequency of 30 GHz or higher may be optically controlled, based on the photoconductive switching region and the semiconductor substrate with an embedded RF transmission line. The optically-controlled switch may show the following technical effects as the parasitic capacitance is reduced and the accuracy and density of parts increase.

As the size of the optically-controlled switch is reduced, the optically-controlled switch is favorable to miniaturization and thus parasitic loss may be reduced.

As the substrate of a low dielectric loss is used in a transmission line and a high-quality conductor is used as the transmission line, insertion loss may be reduced in an extremely high frequency (EHF) range.

When conductivity and carrier lifetime of acceptable levels are achieved, power consumption may be reduced, insulation between the ON/OFF states may be improved, and a switching speed with a switch size reduction may increase.

An operating frequency band may increase, and simple integration into SoI and complementary metal oxide semiconductor (CMOS) devices may be possible.

Hereinbelow, various embodiments will be described.

Figure 13A:
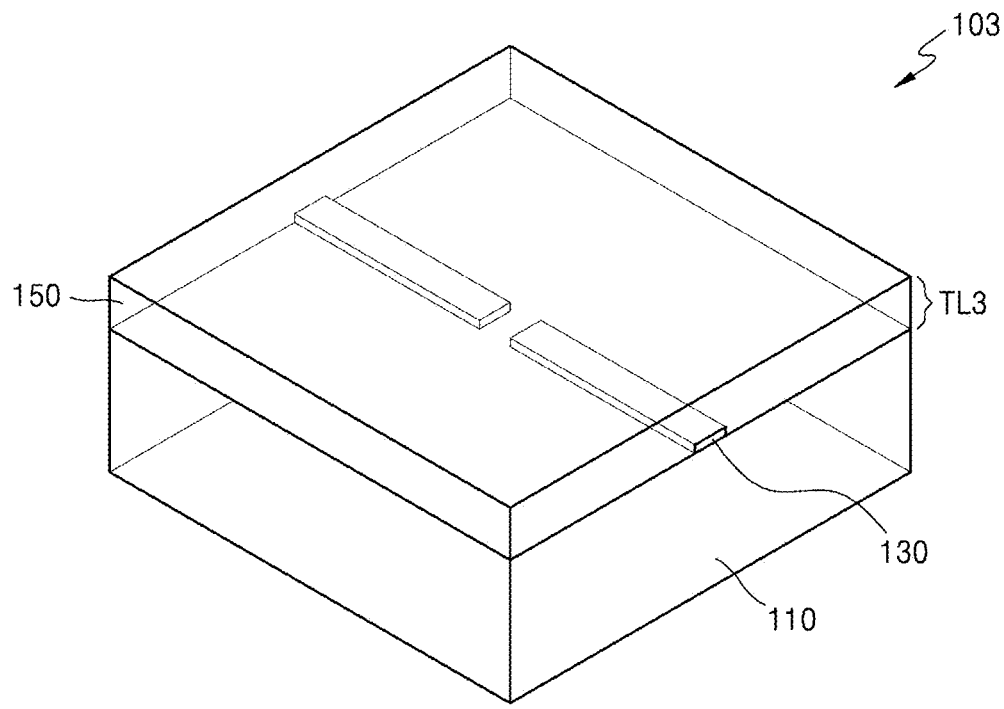
FIGS. 13A, 13B and 13C are perspective views illustrating a schematic structure of an optically-controlled switch according to various embodiments of the disclosure.
Figure 13B:
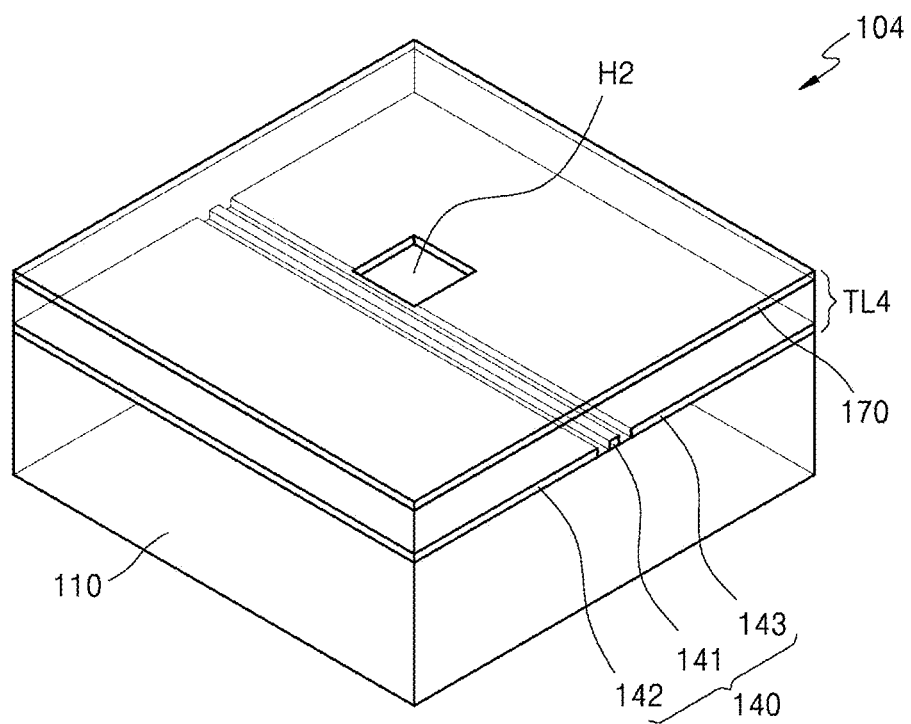
Figure 13C:
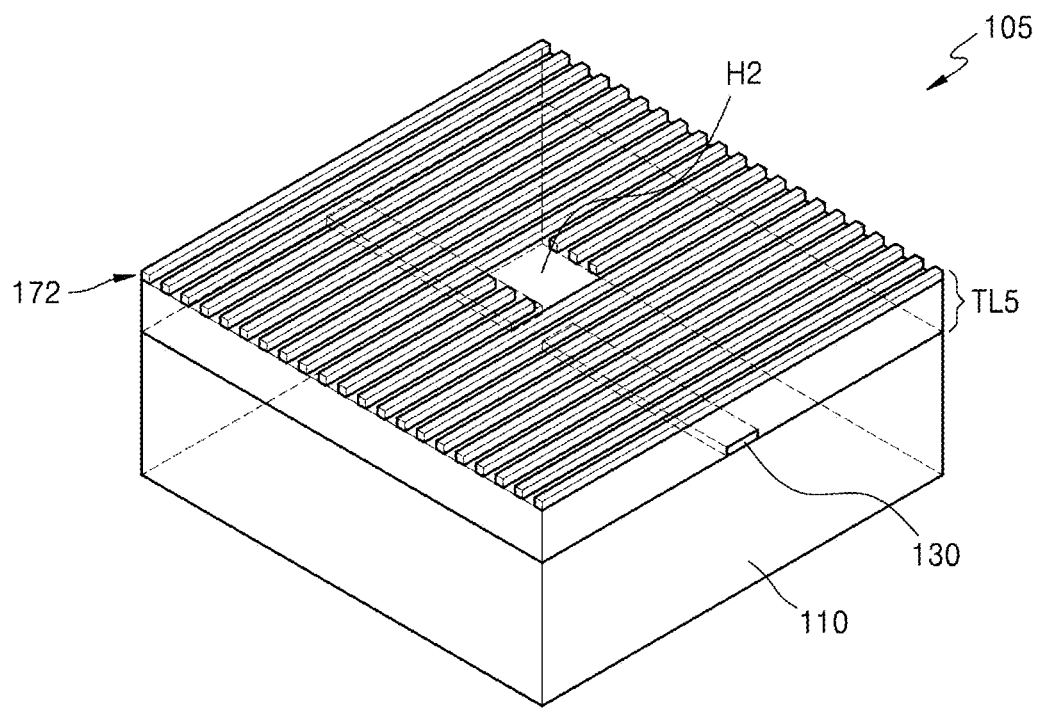

FIGS. 13A to 13C are perspective views illustrating a schematic structure of an optically-controlled switch according to various embodiments of the disclosure.

Referring to FIG. 13A, a transmission line TL3 included in an optically-controlled switch 103 may be a general coplanar waveguide (CPW) having no additional ground layer on the dielectric layer 150.

Referring to FIG. 13B, a transmission line TL4 of an optically-controlled switch 104 may have the opening H2 with a rectangular shape formed in the second conductive layer 170. In addition, the opening H2 may be changed into various shapes capable of delivering light to the photoconductive switching region in the substrate 110, such as a square, a rectangle, an oval, etc.

Referring to FIG. 13C, a transmission line TL5 of an optically-controlled switch 105 may include a second conductive layer 172 with a mesh pattern as a ground layer. As shown, the second conductive layer 172 may be patterned such that multiple strips are repeatedly arranged in a region other than the opening H2. In addition, the shape of the ground layer may be changed into any other convenient configuration.

In FIGS. 13A to 13C, a transmission line in a form that is different from an example may be used for an optically-controlled switch.

In a structure where shorting of a transmission line conductor in a horizontal plane (a surface perpendicular to a stacking direction) is required, the thickness of the substrate 110 may be approximately greater than or equal to a reference length that is set considering the carrier diffusion length in the substrate 110 and the light penetration depth with respect to the wavelength of the light source.

Figure 14A:
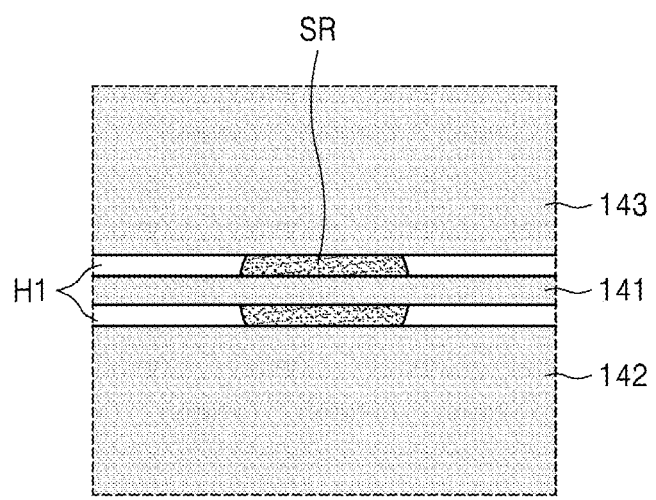
FIGS. 14A, 14B, and 14C are plan views illustrating in detail example shapes of a signal line of a transmission line of an optically-controlled switch around a photoconductive switching region (SR), according to various embodiment of the disclosure.
Figure 14B:
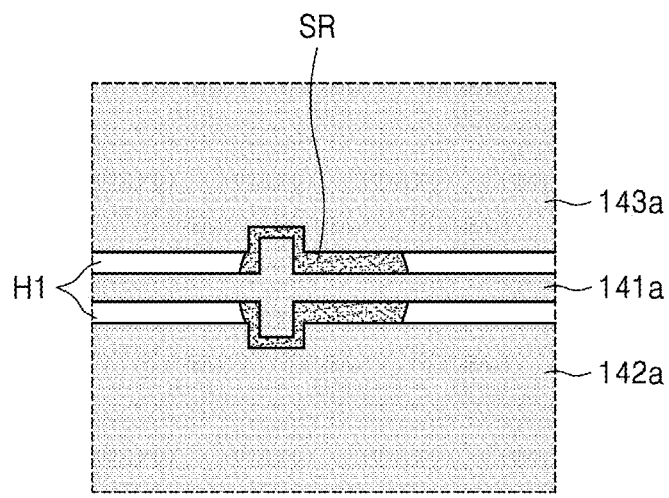
Figure 14C:
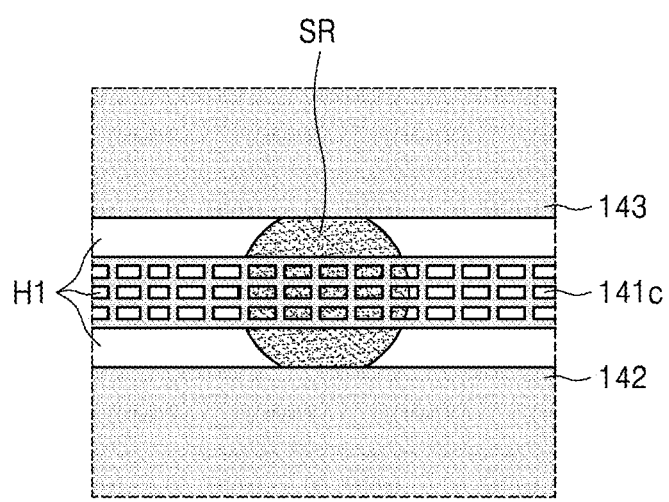

FIGS. 14A to 14C are plan views illustrating in detail example shapes of a signal line of a transmission line of an optically-controlled switch around a photoconductive switching region SR, according to various embodiments of the disclosure.

FIGS. 14A to 14C regard a transmission line based on a coplanar line, i.e., a coplanar waveguide (CPW) and a grounded coplanar waveguide (GCPW).

Referring to FIG. 14A, the signal line 141 may have a constant line width in a region facing the photoconductive switching region SR.

Referring to FIG. 14B, a line width of a signal line 141a may be non-uniform in a part of the region facing the photoconductive switching region SR. That is, the signal line 141a may have a shape protruding toward two adjacent ground surfaces 142a and 143a, such that the two ground surfaces 142a and 143a may have a shape recessed in a portion facing the protruding shape. The signal line 141a may provide a stronger signal reflection in the ON state of the photoconductive switching region SR due to increase in the photoconductive switching region SR and reduction in the shunt resistance.

Referring to FIG. 14C, a signal line 14C is patterned in a grid form. The signal line 141C may have a pattern in a net shape as shown. This shape may provide better excitation of carriers in the photoconductive switching region SR while maintaining the quality of signal transmission.

Figure 15A:
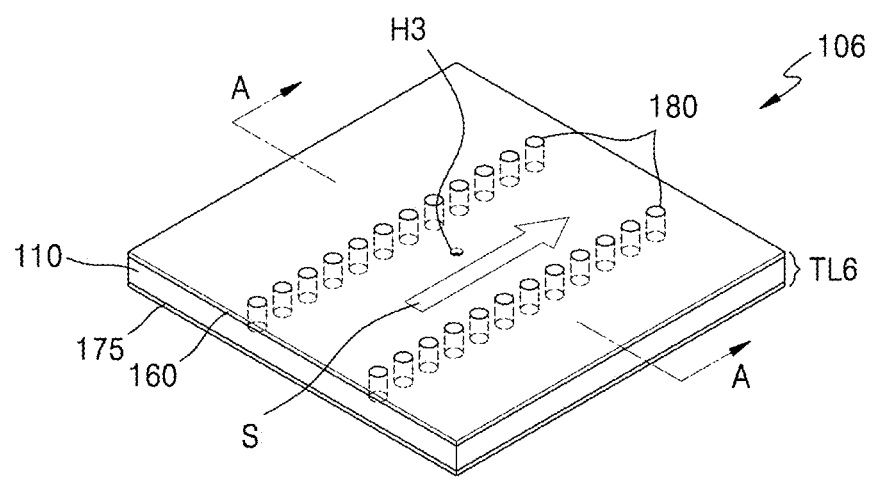
Figure 15B:
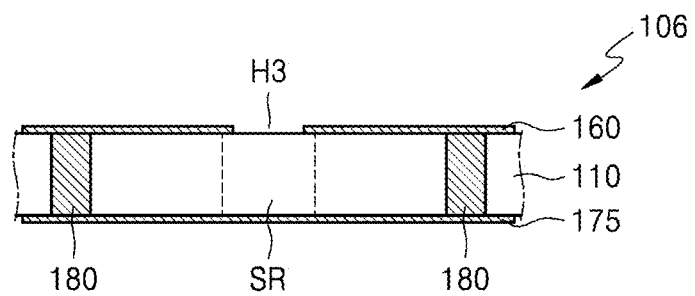

FIGS. 15A to 16B illustrate an optically-controlled switch according to another embodiment, in which FIGS. 15A and 15B show the OFF state according to various embodiments of the disclosure.

Figure 16A:
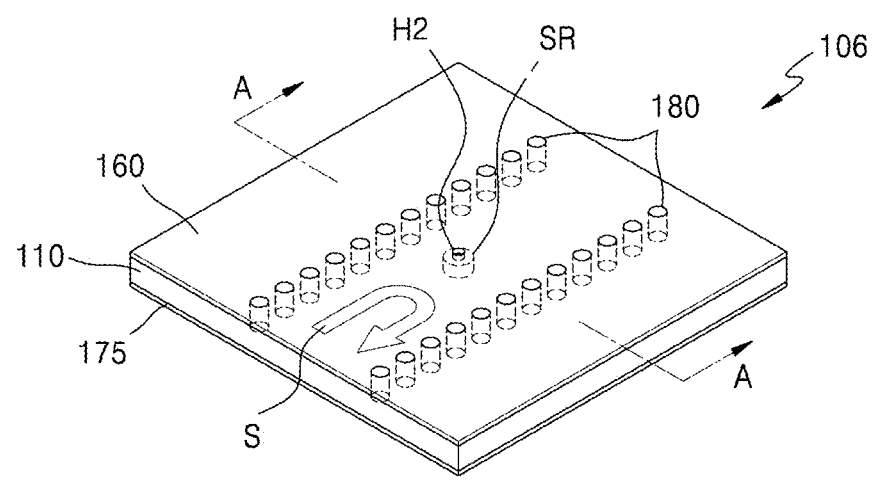
Figure 16B:
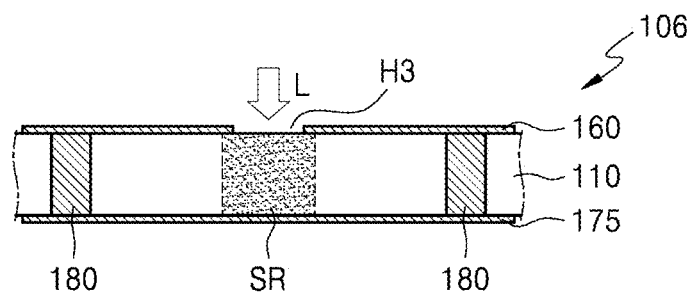

FIGS. 16A and 16B shown the ON state. FIGS. 15B and 16B are A-A cross-sectional views of FIGS. 15A and 16A, respectively according to various embodiments of the disclosure.

Referring to FIGS. 15A to 16B, a transmission line TL6 of an optically-controlled switch 106 according to the current embodiment may be a substrate integrated waveguide, SIW.

The transmission line TL6 may include the substrate 110, a first conductive layer 160 formed on a top surface thereof, and a second conductive layer 175 formed on a bottom surface thereof.

An opening H3 may be formed in the first conductive layer 160, and thus through the opening H3, light may illuminate the photoconductive switching region SR. Although the opening H3 is shown as one, a plurality of openings may be provided without being limited thereto.

A plurality of conductive vias 180 may be arranged to pass through the substrate 110 between the first conductive layer 160 and the second conductive layer 175 to connect the first conductive layer 160 with the second conductive layer 175. The plurality of conductive vias 180 may form a sidewall of the SIW. An interval between the plurality of conductive vias 180 may be less than about $\lambda/10$ when an operating wavelength is $\lambda$. The plurality of conductive vias 180 may be arranged in two rows forming two sidewalls with the photoconductive switching region SR therebetween, as shown.

Referring to FIGS. 15A and 15B, in the OFF state where light is not incident to the photoconductive switching region SR, the photoconductive switching region SR may be in the dielectric state where a region between two sidewalls is opened. The signal S provided to the input of the optically-controlled switch 106 may propagate between the two sidewalls and thus be toward the output.

Referring to FIGS. 16A and 16B, when light is incident to the photoconductive switching region SR, the photoconductive switching region SR may be activated as a conductive region. The signal S provided to the input of the optically-controlled switch 106 may be reflected from a conductive region formed in a space between the two sidewalls and thus may not be toward the output.

In this structure, since a shorting is needed between the first conductive layer 160 and the second conductive layer 175 that are apart from each other in a vertical direction (a stacking direction) in the transmission line in the ON state, the thickness of the substrate 110 has to be substantially equal to or similar to the depth of the photoconductive switching region SR. The depth of the photoconductive switching region SR may be set to a sum of a carrier diffusion length in a semiconductor material forming the substrate 110 and a penetration depth considering the operating frequency of the light source. The thickness of the substrate 110 should be similar to and should not exceed the depth of the photoconductive switching region SR. The thickness of the substrate 110 may be set to the depth of the photoconductive switching region SR or less.

Figure 17:
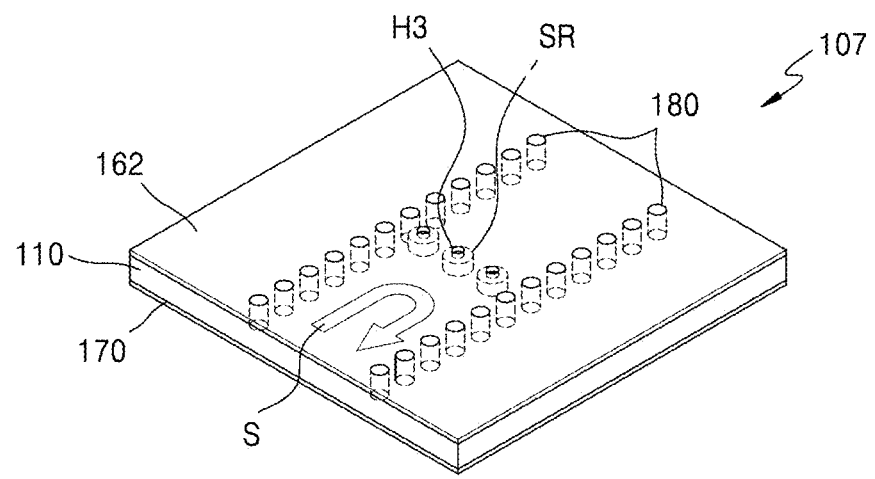
FIG. 17 is a perspective view illustrating a schematic structure of an optically-controlled switch according to an embodiment of the disclosure.

FIG. 17 is a perspective view illustrating a schematic structure of an optically-controlled switch according to an embodiment of the disclosure.

Referring to FIG. 17, the optically-controlled switch 107 is different from the optically-controlled switch 106 described with reference to FIGS. 15A to 16B in that the photoconductive switching region SR is provided in plural. That is, the first conductive layer 162 may include a plurality of openings H3 that pass light therethrough. Light needs to be illuminated toward the plurality of openings H3, and the light source, not shown, may also be provided in plural. In this embodiment, the photoconductive switching region SR activated in the ON state forms a plurality of reflection walls, thereby further improving the effect of blocking transmission of the signal S.

The optically-controlled switch 107 according to the current embodiment may be driven such that the light sources at positions corresponding to the respective openings H3 all may operate or some of them may operate.

Figure 18:
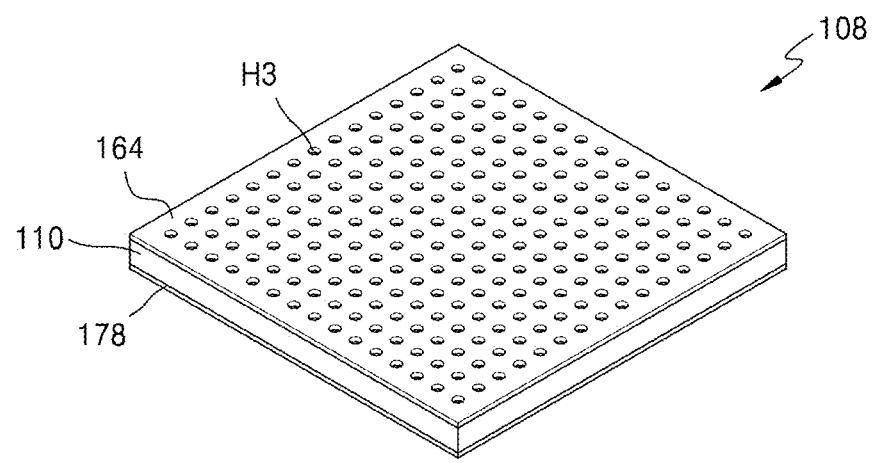
FIG. 18 is a perspective view illustrating a schematic structure of an optically-controlled switch according to an embodiment of the disclosure.

FIG. 18 is a perspective view illustrating a schematic structure of an optically-controlled switch according to an embodiment of the disclosure.

An optically-controlled switch 108 may include the substrate 110, a first conductive layer 164 disposed on a top surface of the substrate 110, and a second conductive layer 178 disposed on a bottom surface of the substrate 110. The first conductive layer 164 may include the plurality of openings H3 that may be arranged in a two-dimensional array as shown. The light source (not shown) may include a plurality of laser arrays. For example, a VCSEL array capable of irradiating light to each of the plurality of openings H3 may be used as the light source. Predetermined regions in the substrate 110, which respectively face the plurality of openings H3, may be photoconductive switching regions, and the plurality of photoconductive switching regions may also be arranged in a two-dimensional array along arrangement of the openings H3. In FIG. 18, the photoconductive switching region is not shown for convenience.

Referring to FIG. 18, the optically-controlled switch 108 according to an embodiment is structured such that a conductive via is not provided between the first conductive layer 164 and the second conductive layer 178, and in the ON state, some of the plurality of photoconductive switching regions are selectively activated to form a waveguiding path of the SIW.

That is, in the OFF state where light is not irradiated to the substrate 110 through the opening H3, the photoconductive switching region is in the dielectric state without being activated, and the waveguiding path in the optically-controlled switch 108 may be any direction.

Figure 19A:
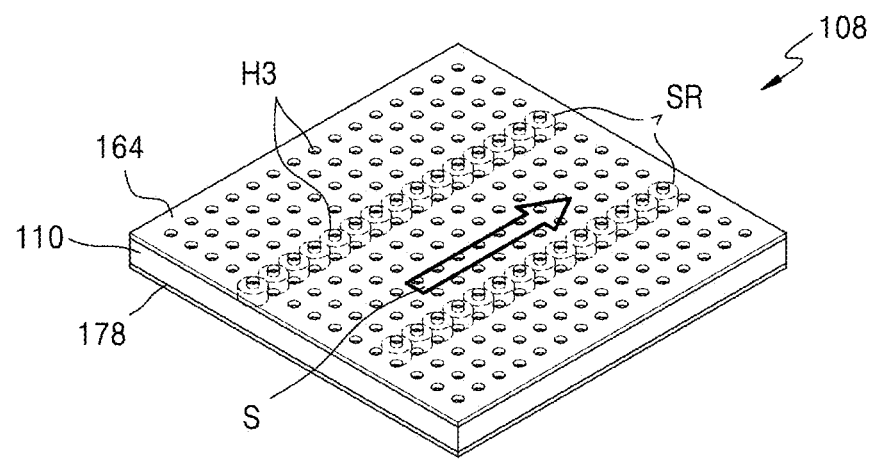
FIGS. 19A and 19B illustrate examples where an optically-controlled switch of FIG. 18 is in an ON state according to various embodiments of the disclosure.

FIG. 19A illustrates a case where an optically-controlled switch of FIG. 18 is in an ON state according to an embodiment of the disclosure.

FIG. 19A shows a case where some of the plurality of photoconductive switching regions SR are selectively activated. Thus, referring to FIG. 19A, two conductive sidewalls may be formed and the waveguiding path of the signal S may be formed along a space between the two conductive sidewalls.

Figure 19B:
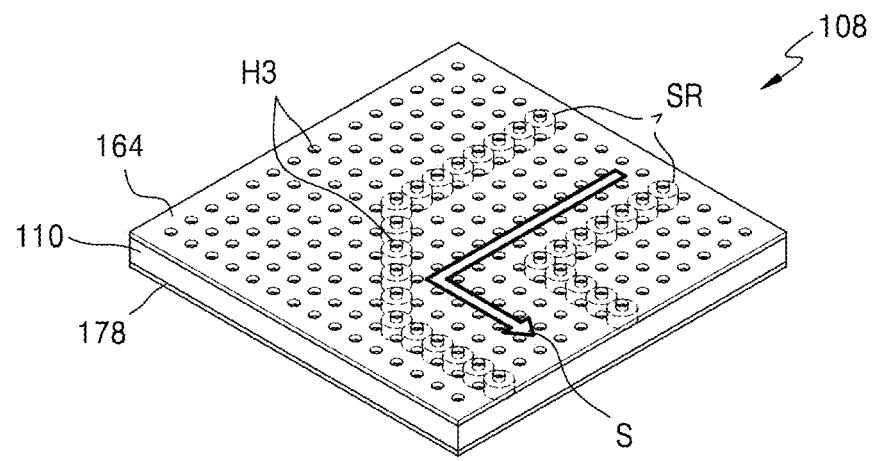

FIG. 19B shows a case where the optically-controlled switch of FIG. 18 is in the ON state and photoconductive switching regions at positions that are different from those of FIG. 19A are activated according to an embodiment of the disclosure.

Referring to FIG. 19B, two conductive sidewalls in a form that is different from FIG. 19A may be formed according to the plurality of activated photoconductive switching regions SR, and the waveguiding path of the signal may be formed along a space between the two conductive sidewalls.

The optically-controlled switch 108 according to such an embodiment may have a completely reconfigurable structure. The signal S provided to the input of the optically-controlled switch 108 may be directed to a desired any point in the device based on a selection of the photoconductive switching regions to be activated. Thus, this structure may be used for power distribution/power summation, a phase shifter, and other passive RF structure.

Figure 20:
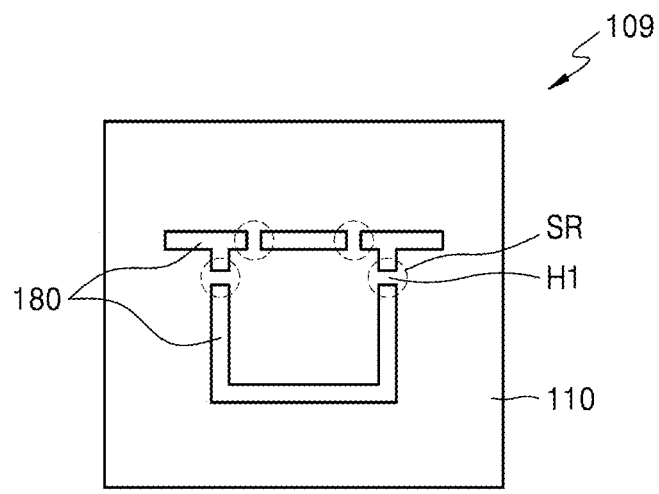
FIG. 20 is a plan view illustrating a structure of a phase shifter using an optically-controlled switch according to an embodiment of the disclosure.

FIG. 20 is a plan view illustrating a structure of a phase shifter, according to an embodiment of the disclosure.

Referring to FIG. 20, a phase shifter 109 may include the substrate 110 and transmission line segments 190 formed on the substrate 110. The transmission line segments 190 may be branches that provide necessary phase delay when the signal passes through them. A gap H1 may be formed between the transmission lines segments 190. The gap H1 may be a length comparable to the width of the transmission line segments 190. A light source having an aperture similar to the gap H1 may be disposed at a position facing the gap H1. When the inside of the substrate 110 is illuminated through the gap H1, the photoelectric switching region SR may be formed in the substrate 110.

In the above-described embodiments, local processing may be performed at a position where the photoelectric switching region SR is to be formed in the substrate 110. When the semiconductor material that is a material of the substrate 110 has a long carrier lifetime, a method of reducing the free carrier lifetime in the semiconductor (within the required period) may be used. For example, in a process of manufacturing a silicon substrate, a method of introducing a new recombination center into silicon may be directly used. To this end, some approaches, such as ion implantation, electron beam irradiation, etc., may be possible. Thus, without a need to install a separate photoconductive element on a substrate, relatively various materials may be used for the substrate 110. When necessary, the entire substrate may be subject to such processing.

Figure 21:
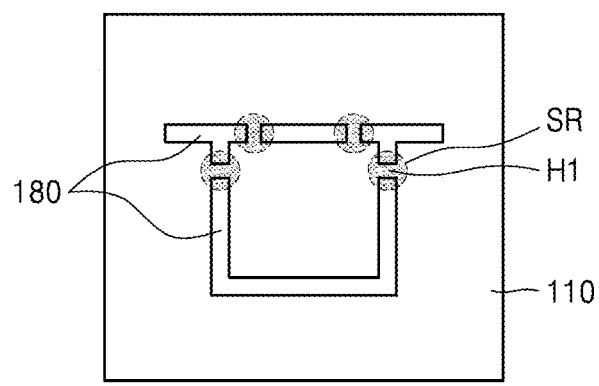
FIGS. 21 and 22 illustrate an example of local processing with respect to a photoconductive switching region according to an embodiment of the disclosure.

FIG. 21 shows an example of local processing with respect to a photoconductive switching region by using a structure of a phase shifter of FIG. 20 according to an embodiment of the disclosure.

Referring to FIG. 21, an area where the photoelectric switching region SR should be located in the substrate 110 is indicated by a dotted circuit, and ion bombardment may be performed on this area. Thus, the free carrier lifetime may be reduced and the photoconductive switching region having desired characteristics may be formed in this region.

When there is a photoconductive effect on the entire substrate, the density of the photoelectric switching region may be defined by a photoconductive region, i.e. by a sum of the aperture size of the light source and the diffusion length. A distance between the adjacent photoconductive switching regions may be set larger by at least one other diffusion length. Thus, around the photoconductive switching region, the conductivity may decrease exponentially.

Figure 22:
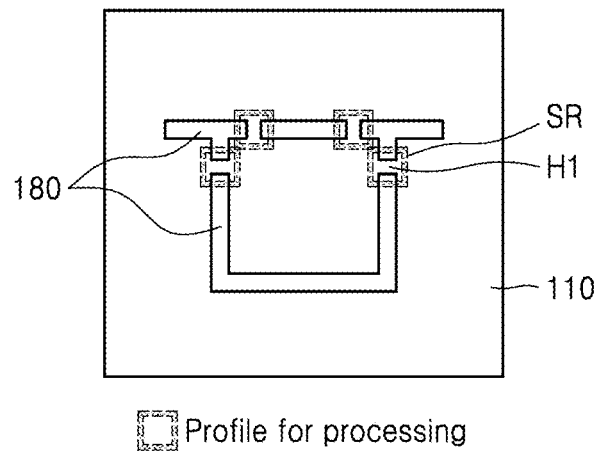

FIG. 22 shows another example of local processing with respect to a photoconductive switching region by using a structure of a phase shifter of FIG. 20 according to an embodiment of the disclosure.

Referring to FIG. 22, the illustrated local processing limits the photoconductive switching region when the substrate material has a generally required carrier lifetime, as a situation different from FIG. 21. To this end, an edge may be formed in which carriers are rapidly recombined around the photoconductive switching region. As a processing method, ion injection, electronic beam irradiation, etc., may be used. Thus, edges where the free carrier lifetime decreases sharply and carriers recombine very rapidly may be formed, and within the edges, the photoconductive switching region with the desired characteristics may still remain. This makes it possible to increase the element packing density on the substrate already made of a material suitable for use directly as a photoconductive switching region.

FIGS. 21 and 22 illustrate the phase shifter of FIG. 20 to describe local processing for the substrate region where the photoelectric switching region is to be located. This is an example, and the aforementioned local processing may be performed on a substrate of any desired device including an optically-controlled switch according to the embodiment.

The optically-controlled switch described above may be utilized in various fields. For example, the optically-controlled switch may be used in circulators, phase shifters, rectifiers, antennas with adaptive beamforming, etc., and in electronic devices that require control by RF signals (for example, in the millimeter-wave range for mobile communication networks of the future standards 5G, 6G and WiGig), for various sensors, Wi-Fi networks, long-range wireless power transmission, smart home systems, millimeter-wave adaptive intelligent systems, car navigation, the Internet of things (IoT), wireless power charging, etc.

Figure 23:
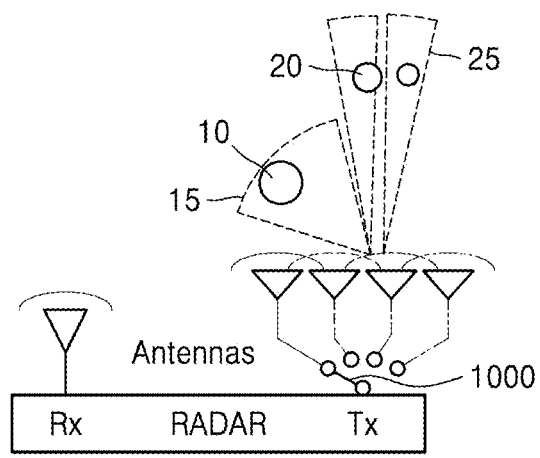
FIG. 23 is a conceptual view schematically illustrating a structure of a radar system to which an optically-controlled switch according to an embodiment of the disclosure.

FIG. 23 is a conceptual view schematically illustrating a structure of a radar system to which an optically-controlled switch according to an embodiment of the disclosure.

Referring to FIG. 23, the radar system, as a single device, may have a structure where a short range radar (SRR), a middle range radar (MRR), and a long range radar (LRR) are implemented in one device. Antennas for a short range, a middle range, and a long range may be connected by an optically-controlled switch 1000 in a transmission end Tx of the radar. As the optically-controlled switch 1000, any one of the optically-controlled switches 100, 101, 102, 103, 104, 105, 106, 107, and 108 according to various embodiments described above or a modified form thereof may be used. An LRR beam 25 may be irradiated for an LRR target 20, and an SRR beam 15 may be irradiated for an SRR target 10. Transition of SRR/LRR may be performed at high speed, thus implementing high resolution.

In the current embodiments, the element/unit of the optically-controlled switch may be disposed in a common housing, placed on the same frame/structure/substrate/printed circuit board and connected to each other structurally and functionally via a communication line by a mounting (assembly) operation. Unless otherwise specified, the communication line or channel may be substantially implemented using an existing communication line. The communication lines or channels, unless specified otherwise, may be wire, set of wires, bus, path, wireless communication link (inductive, radio frequency, infrared, ultrasonic, etc.), and communication protocols over communication links are known in the art and are not described separately.

Functional relationship of elements should be understood as a connection providing correct cooperation of these elements with each other and implementing a particular functionality of elements. Particular examples of the functional relationship may be a connection providing exchange of information, a connection providing transmission of electric current, a connection providing transfer of mechanical motion, a connection providing transmission of light, sound, electromagnetic or mechanical vibrations, etc. The functional relationship is determined by the nature of interaction of the elements, and, unless otherwise specified, is provided by well-known means using the principles well-known in the art.

Structural embodiment of elements of the device is known to those skilled in the art and is not described separately in this document, unless otherwise specified. Elements of the device may be made of any suitable material, and may be manufactured using known methods, including, merely by way of example, machining and lost-wax casting. Assembly, connection and other operations in accordance with the above description also correspond to the knowledge of the person skilled in the art and, thus will not be explained in more detail here.

The functions of the elements designated as a single element in the description or claims may be actually implemented via various components of the device, and vice versa, the components described as several individual components in the description or claims may be actually implemented as a single component.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An optically-controlled switch comprising:
A circuit board comprising:
   A substrate formed of photoconductive material and including a photoconductive switching region;
   A transmission line, wherein
The transmission line comprises a first conductive layer disposed on the substrate to form a signal line of the transmission line, the first conductive layer including a gap facing the photoconductive switching region, a first dielectric layer formed on the first conductive layer, and a second conductive layer comprising a pattern including a second gap facing the photoconductive switching region; and
A laser formed on the circuit board, the laser configured to emit light toward the photoconductive switching region; and
Wherein a light emitted by the laser passes through the gap facing the photoconductive switching region and the second gap facing the photoconductive switching region,
Wherein a thickness of the substrate does not exceed a depth of the photoconductive switching region, and
Wherein the depth of the photoconductive switching region is a sum of a carrier diffusion length in a semiconductor material forming the substrate and a penetration depth determined based on an operating frequency of the laser.

2. The optically-controlled switch of claim 1, wherein the laser comprises:
   a lower reflection layer disposed on the circuit board;
   an active layer disposed on the lower reflection layer; and
   an upper reflection layer disposed on the active layer, and
wherein a reflectivity of the lower reflection layer is lower than a reflectivity of the upper reflection layer.

3. The optically-controlled switch of claim 1,
Wherein the
first dielectric layer is disposed between the first conductive layer and the second conductive layer.

4. The optically-controlled switch of claim 3,
wherein the transmission line is a grounded coplanar waveguide, and
wherein the first conductive layer comprises:
   the signal line in a strip form covering a part of an upper portion of the photoconductive switching region and extending in a direction; and
   two ground surfaces disposed apart from each other on both sides of the signal line coplanarly with the signal line.

5. The optically-controlled switch of claim 4, wherein the signal line has a non-uniform thickness in a part of a region facing the photoconductive switching region or has a grid pattern.

6. The optically-controlled switch of claim 3,
Wherein the second conductive layer is a ground layer of the transmission line.

7. The optically-controlled switch of claim 6,
wherein the transmission line is a micro stripline, and
wherein the first conductive layer comprises two segments spaced apart from each other with the photoconductive switching region therebetween.

8. The optically-controlled switch of claim 6,
wherein the transmission line is a grounded coplanar waveguide, and
wherein the first conductive layer comprises:
   the signal line in a strip form covering a part of an upper portion of the photoconductive switching region and extending in a direction; and
   two ground surfaces disposed apart from each other on both sides of the signal line coplanarly with the signal line.

9. The optically-controlled switch of claim 8, wherein the signal line has a non-uniform thickness in a part of a region facing the photoconductive switching region or has a grid pattern.

10. The optically-controlled switch of claim 1, wherein the transmission line is a substrate integrated waveguide comprising:
   the first conductive layer;
   the substrate; and
   a second conductive layer formed on a bottom surface of the substrate.

11. The optically-controlled switch of claim 10,
wherein a plurality of conductive vias that pass through the substrate are formed between the first conductive layer and the second conductive layer, and
wherein the plurality of conductive vias are arranged in two rows to form two conductive sidewalls with the photoconductive switching region therebetween.

12. The optically-controlled switch of claim 10,
wherein the photoconductive switching region includes a plurality of photoconductive switching sub-regions two-dimensionally arranged,
wherein the first conductive layer has a pattern comprising a plurality of openings respectively facing the plurality of photoconductive switching sub-regions, and
wherein some of the plurality of photoconductive switching sub-regions are selectively activated to form a reconfigurable conductive sidewall of the substrate integrated waveguide.

13. The optically-controlled switch of claim 1, wherein the photoconductive switching region is made in the substrate by using a processing method of introducing a new recombination center to a semiconductor material of the substrate.

* * * * *